US012781622B2

(12) United States Patent
Chen et al.

(10) Patent No.: US 12,781,622 B2
(45) Date of Patent: Nov. 3, 2026

(54) CORRECTION OF DISTORTED GRADIENT DISTRIBUTIONS IN NUCLEAR MAGNETIC RESONANCE LOGGING

(71) Applicant: Halliburton Energy Services, Inc., Houston, TX (US)

(72) Inventors: Songhua Chen, Houston, TX (US); Wei Shao, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 1198 days.

(21) Appl. No.: 17/462,968

(22) Filed: Aug. 31, 2021

(65) Prior Publication Data

US 2023/0068555 A1 Mar. 2, 2023

(51) Int. Cl.

| | |
|---|---|
| ***E21B 49/00*** | (2006.01) |
| ***G01V 3/32*** | (2006.01) |
| ***G01V 3/38*** | (2006.01) |
| ***G01V 20/00*** | (2024.01) |
| ***G06F 30/28*** | (2020.01) |

(52) U.S. Cl.

CPC ................ *E21B 49/00* (2013.01); *G01V 3/32* (2013.01); *G01V 3/38* (2013.01); *G01V 20/00* (2024.01); *G06F 30/28* (2020.01); *E21B 2200/20* (2020.05)

(58) Field of Classification Search

CPC ...... E21B 49/00; E21B 2200/20; G06F 30/28; G06F 30/20; G01V 20/00; G01V 3/32; G01V 3/38

See application file for complete search history.

(56) References Cited

U.S. PATENT DOCUMENTS

| | | | | |
|---|---|---|---|---|
| 7,804,297 | B2 | 9/2010 | Romero | |
| 10,301,924 | B2 * | 5/2019 | Utsuzawa | G01V 3/18 |
| 2015/0177352 | A1 | 6/2015 | Li et al. | |
| 2016/0139291 | A1 | 5/2016 | Saidian et al. | |

(Continued)

FOREIGN PATENT DOCUMENTS

WO WO-2005067569 A2 * 7/2005 ............. G01N 24/08

OTHER PUBLICATIONS

S. Ye, A. Scribner, D. Mclendon, and O. Ijasan, S. Chen, W. Shao, and R. Balliet, "Method of Determining Unconventional Reservoir Saturation with NMR Logging" pp. 1-15, 2019 (Year: 2019).*

(Continued)

*Primary Examiner* — Kibrom K Gebresilassie

(74) *Attorney, Agent, or Firm* — Michael Jenney; C. Tumey Law Group PLLC

(57) ABSTRACT

Methods for correcting a gradient distribution in downhole NMR logging are described herein. NMR data is inverted using an effective gradient to obtain an apparent $T_2$ distribution having a first main peak and a distortion caused by a second spurious peak. The first main peak corresponds to the effective gradient. The distortion in the apparent $T_2$ distribution is then corrected by integrating the signal corresponding to the spurious peak into the signal corresponding to the main peak. The corrected apparent $T_2$ distribution and the effective gradient are then used to interpret the NMR data. Thereafter, the interpreted data is used to determine one or more characteristics of the surrounding subsurface rock formation media.

20 Claims, 12 Drawing Sheets

(56) References Cited

U.S. PATENT DOCUMENTS

| | | | | |
|---|---|---|---|---|
| 2016/0170070 | A1* | 6/2016 | Jachmann | E21B 47/00 324/303 |
| 2018/0059281 | A1* | 3/2018 | Arro | G01V 11/00 |
| 2019/0033483 | A1* | 1/2019 | Shao | G01V 3/32 |
| 2019/0187323 | A1 | 6/2019 | Arro | |

OTHER PUBLICATIONS

Search Report and Written Opinion issued for International Patent Application No. PCT/US2021/048493, dated May 19, 2022, 8 pages.

Chen et al., "Systematic Optimization Approach for High-Resolution NMR Logging," SPWLA 59th Annual Logging Symposium, Jun. 2-6, 2018.

Freedman et al., "Field Applications of a New Nuclear Magnetic Resonance Fluid Characterization Method," SPE Reservoir Evaluation & Engineering, vol. 5, Issue 6, pp. 455-464, Dec. 2002.

* cited by examiner

CORRECTION OF DISTORTED GRADIENT DISTRIBUTIONS IN NUCLEAR MAGNETIC RESONANCE LOGGING

FIELD OF THE INVENTION

The present invention relates generally to hydrocarbon exploration using nuclear magnetic resonance (NMR) logging and, more specifically, to methods and systems to correct gradient distributions in downhole NMR.

BACKGROUND

In the field of logging (e.g. wireline logging, logging while drilling (LWD) and measurement while drilling (MWD)), NMR tools have been used to explore the subsurface based on the magnetic interactions with subsurface material. Some downhole NMR tools include a magnet assembly that produces a static magnetic field, and a coil assembly that generates radio frequency (RF) control signals and detects magnetic resonance phenomena in the subsurface material. Properties of the subsurface material can be identified from the detected phenomena.

NMR has two main experiments in oil field downhole usage. The first experiment is to assess $T_1$ buildup of magnetization. The second experiment is to observe the decay of magnetization once it has been excited, in which the decay has a time constant of $T_2$. In a gradient field, the measured apparent $T_2$ is accelerated by the diffusion induced additional decay, which masks the intrinsic $T_2$, i.e., the $T_2$ value corresponding to measurement in a zero-gradient field.

Measurement of $T_1$ is indirect and is done by varying the polarization times after magnetization has, through some means, been nullified or inverted. For downhole observation, a NMR measurement technique, designed by Carr, Purcell, Meiboom, and Gill and, hence, referred to as CPMG, is used. It is considered a $T_2$ measurement. CPMG has an excitation pulse followed by several refocusing pulses to counter the magnetic gradients in downhole NMR systems.

A $T_1$ sequence is typically done as: Saturation pulse—WaitTime—Excitation Pulse—Recover pulses. Typically, the sequence has several different wait times. The number of recovery pulses may be as few as 1 and as many as the electronics can handle. Typically, the number of recovery pulses is less than 5000 for downhole operation. Further, while an NMR logging tool moves during wireline logging or while drilling, tripping, the proton spins in the formation inside and in the vicinity of the tool's sensitive volume align themselves parallel or antiparallel to the static magnetic field generated by the NMR logging instrument, and the net magnetization by these spins obey Boltzmann statistics. The magnitude at which the magnetization does this is proportional to the magnetic field. However, as in any system that gets perturbed, it takes time to get to an equilibrium state. The rate at which the equilibrium is achieved is described by the time constant $T_1$, mentioned above.

Today, high-gradient, side-looking NMR logging instruments are used and the field gradients generated by these tools inside a sensitive volume are non-uniform. On the other hand, conventional NMR interpretation algorithms approximate a uniform gradient within the sensitive volume. Such an approximation is tolerable when the gradient value is small, but causes distortion in relaxation time distribution for 1D inversion, and may result in inaccurate fluid typing and pore typing with 1D, 2D, and/or 3D inversion, if the gradient value is high. This problem is also dependent upon the underlying $T_2$ distribution of the fluid, the diffusivity, and acquisition parameter settings, and is most significant for slow-relaxing formations and high diffusivity fluids at high inter-echo time settings.

DETAILED DESCRIPTION

The following detailed description illustrates embodiments of the present disclosure. These embodiments are described in sufficient detail to enable a person of ordinary skill in the art to practice these embodiments without undue experimentation. It should be understood, however, that the embodiments and examples described herein are given by way of illustration only, and not by way of limitation. Various substitutions, modifications, additions, and rearrangements may be made that remain potential applications of the disclosed techniques. Therefore, the description that follows is not to be taken as limiting on the scope of the appended claims. In particular, an element associated with a particular embodiment should not be limited to association with that particular embodiment but should be assumed to be capable of association with any embodiment discussed herein.

Embodiments and methods of the present disclosure provide embodiments and methods for correcting a gradient distribution in downhole NMR logging. In a generalized method, an NMR tool positioned in a borehole is used to acquire data. The data is inverted using an effective gradient to obtain an apparent $T_2$ distribution having a first main peak and a distortion caused by a second spurious peak. The first main peak corresponds to the effective gradient. The distortion in the apparent $T_2$ distribution is then corrected by integrating the signal corresponding to the spurious peak into the signal corresponding to the main peak. The corrected apparent $T_2$ distribution and the effective gradient are then used to interpret the NMR data. Thereafter, the interpreted data is used to determine one or more characteristics of the surrounding hydrocarbon bearing formation or water reservoir (subsurface rock formation media).

Figure 1:
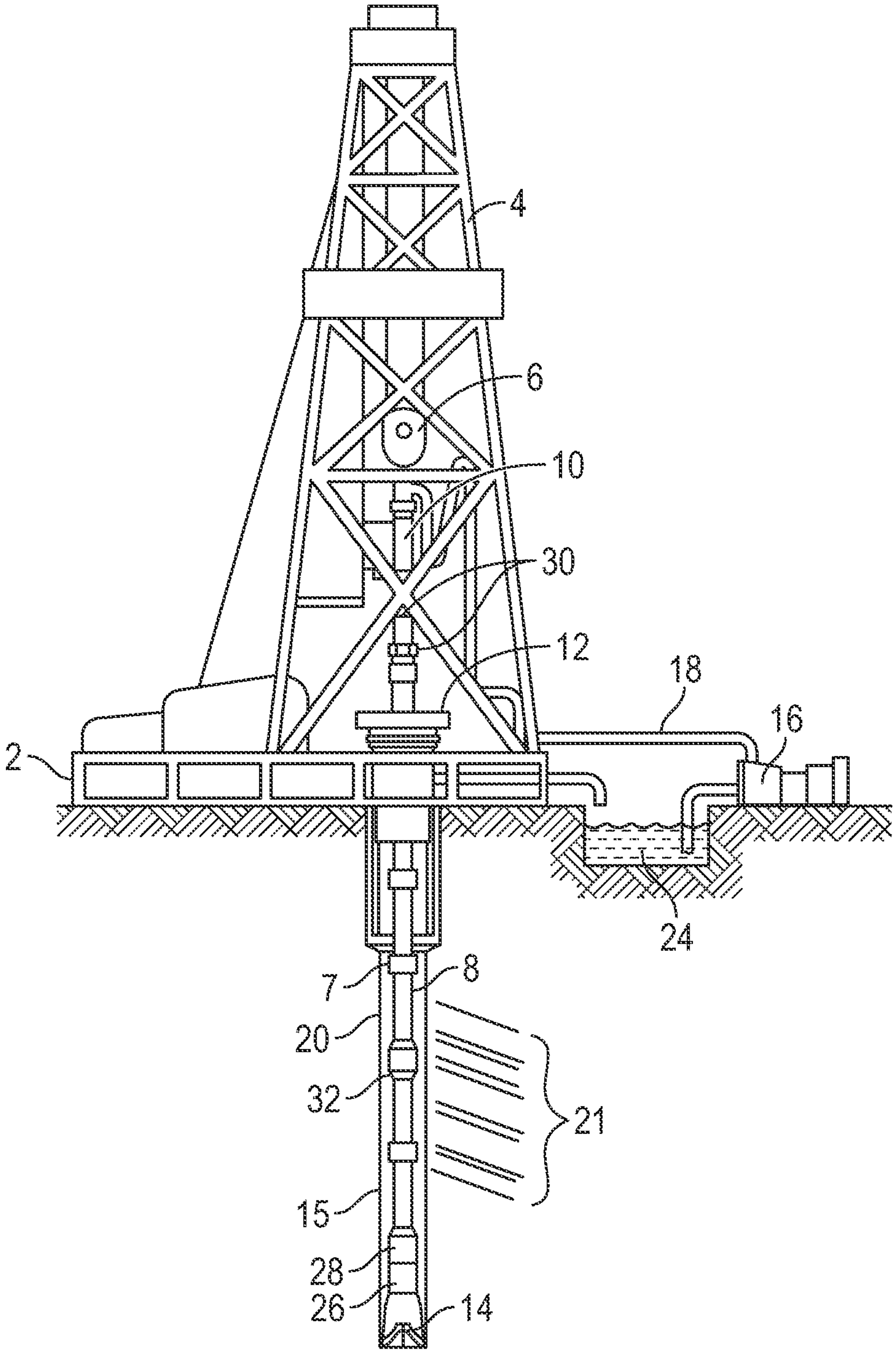
FIG. 1 shows an illustrative logging while drilling (LWD) environment.

FIG. 1 shows an illustrative logging while drilling (LWD) environment of the present disclosure. A drilling platform 2 supports a derrick 4 having a traveling block 6 for raising and lowering a drill string 8. A top drive 10 supports and rotates the drill string 8 as the string is lowered through a well head 12. The drill string's rotation (and/or a downhole motor) drives a drill bit 14 to extend the borehole 15 through subsurface earth formations 21. Mud recirculation equipment 16 draws drilling fluid from a retention pit 24 and pumps it through a feed pipe 18 to top drive 10, through the interior of drill string 8 to the drill bit 14, through orifices in the drill bit, through the annulus around drill string 8 to a blowout preventer at the surface, and through a discharge pipe into the pit 24. The drilling fluid transports cuttings from the borehole into the pit 24 and aids in maintaining the borehole integrity.

A nuclear magnetic resonance (NMR) logging tool 26 is integrated into the bottom-hole assembly near the bit 14. The NMR logging tool 26 may take the form of a drill collar, i.e., a thick-walled tubular that provides weight and rigidity to aid the drilling process. As the bit extends the borehole through the formations, the NMR logging tool collects measurements relating to spin relaxation time ($T_1$, $T_2$, $T_p$, and/or $T_2$*) distributions as a function of depth or position in the borehole. The NMR tool has a magnet, antenna, and supporting electronics. The permanent magnet in the tool causes the nuclear spins to build up into a cohesive magnetization, also sometimes referred to as polarization. The $T_2$ is measured through the decay of excited magnetization while $T_1$ is measured by the buildup of magnetization. Other tools and sensors can also be included in the bottomhole assembly to gather measurements of various drilling parameters such as position, orientation, weight-on-bit, borehole diameter, etc. Control/telemetry module 28 collects data from the various bottomhole assembly instruments (including position and orientation information) and stores them in internal memory, which may be able to store hundreds of hours of data. Selected portions of the data (raw or processed) can be communicated to surface receivers 30 by, e.g., mud pulse telemetry. Other logging-while drilling telemetry methods also exist and could be employed. For example, electromagnetic telemetry or through-wall acoustic telemetry can be employed with an optional repeater 32 to extend the telemetry range. Most telemetry systems also enable commands to be communicated from the surface to the control and telemetry module to configure the operation of the tools.

Figure 2:
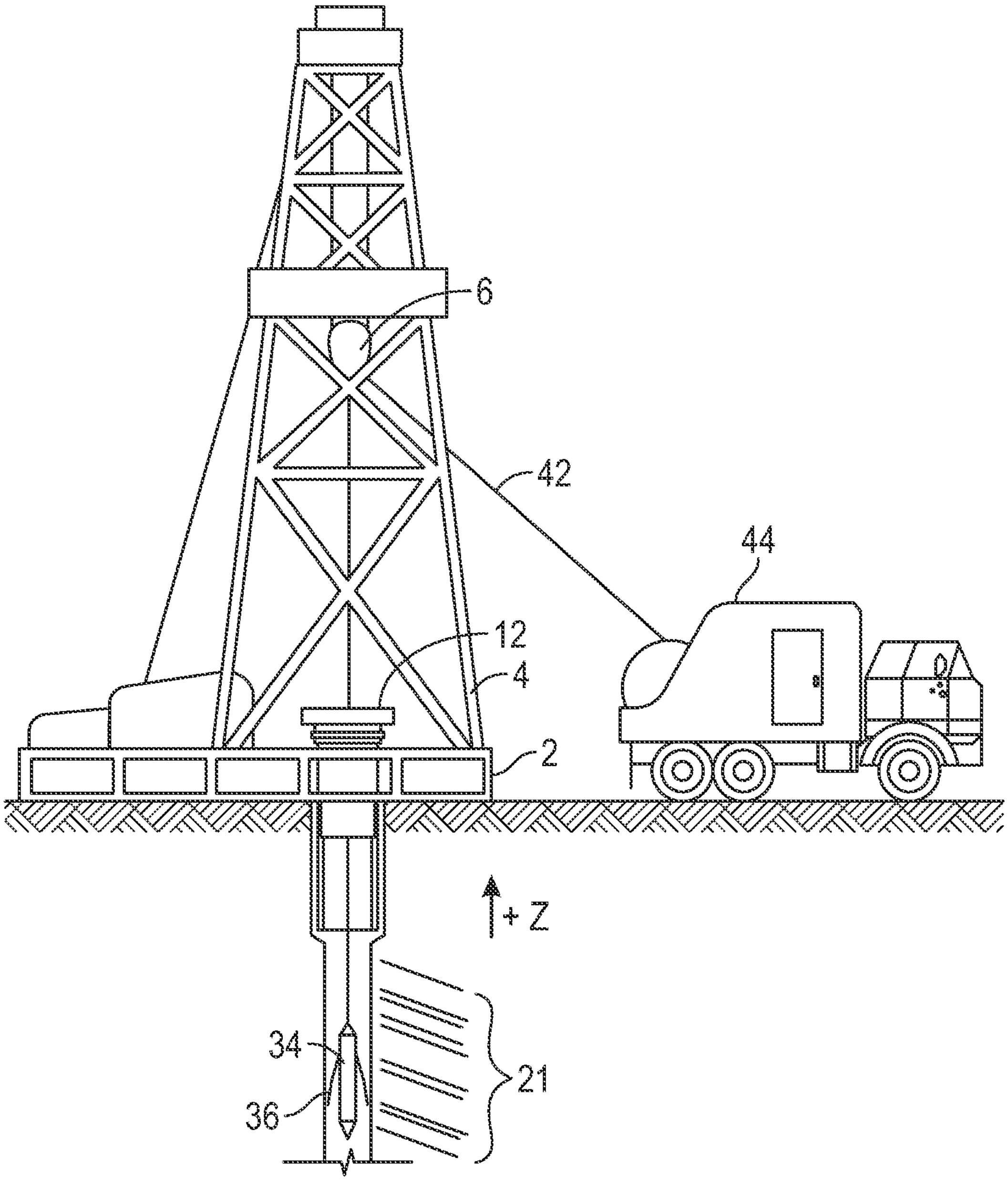
FIG. 2 shows an illustrative wireline logging environment.

FIG. 2 shows an illustrative wireline logging environment. At various times during the drilling process, the drill string 8 may be removed from the borehole as shown in FIG. 2. Once the drill string has been removed, logging operations can be conducted using a wireline logging tool 34, i.e., a sensing instrument sonde suspended by a cable 42 having conductors for transporting power to the tool and telemetry from the tool to the surface. The wireline logging tool 34 may have pads 36 and/or centralizing springs or a decentralizer to maintain the tool in the right position, for example, that could be near the axis of the borehole or against wall, as the tool is pulled uphole. As explained further below, tool 34 can include an NMR logging instrument that collects relaxation time distribution measurements. A logging facility 44 collects measurements from the logging tool 34 and includes a computer system for processing and storing the measurements gathered by the logging tool.

Figure 3:
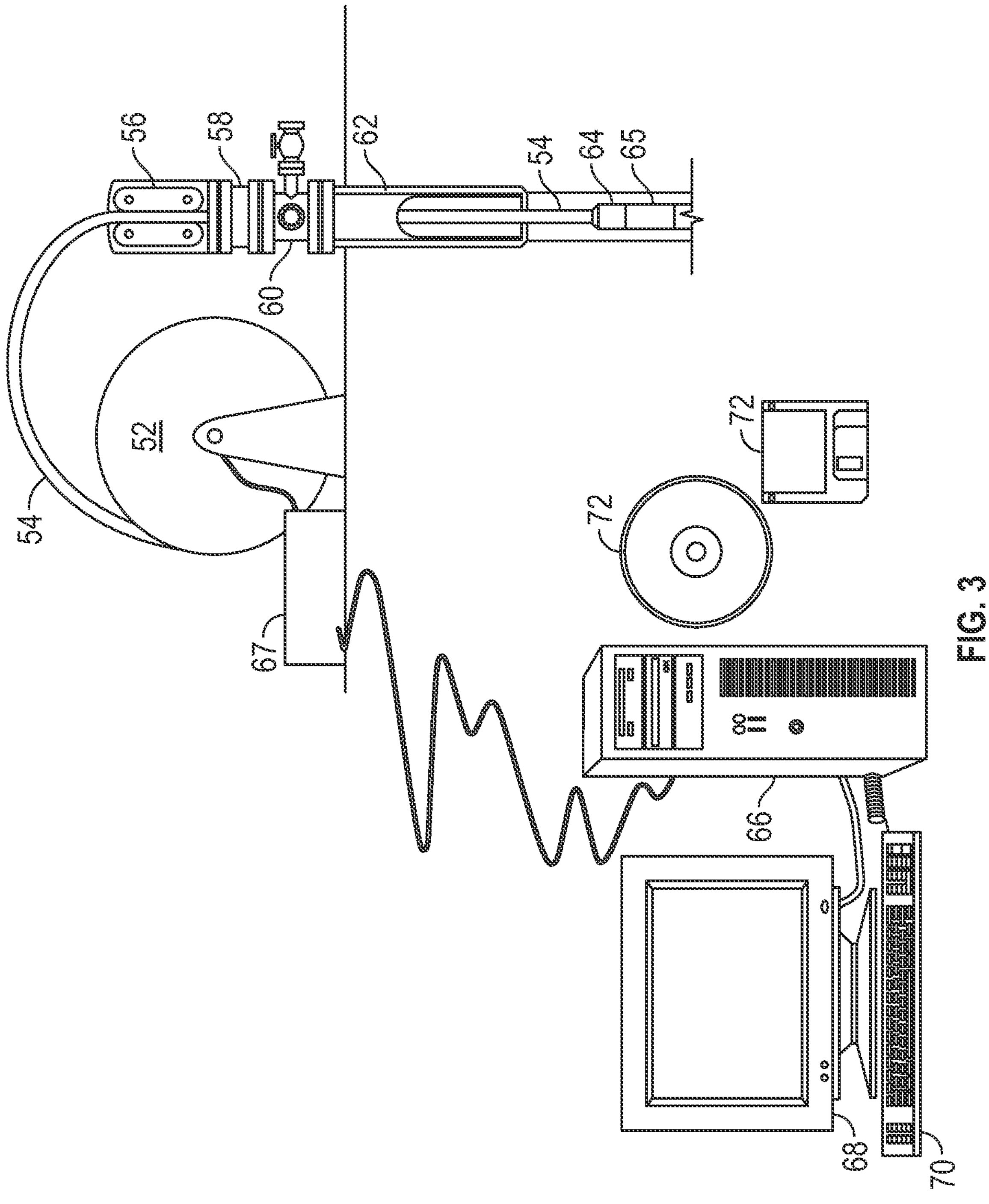
FIG. 3 shows an illustrative coil tubing logging system.

An alternative logging technique is tubing-conveyed logging. FIG. 3 shows an illustrative coil tubing logging system in which coil tubing 54 is pulled from a spool 52 by a tubing injector 56 and injected into a well through a packer 58 and a blowout preventer 60 into the well 62. In the well, a supervisory sub 64 and one or more logging tools 65 are coupled to the coil tubing 54 and configured to communicate to a surface computer system 66 via information conduits or other telemetry channels. An uphole interface 67 may be provided to exchange communications with the supervisory sub and receive data, to be conveyed to the surface computer system 66.

Surface computer system 66 is configured to communicate with supervisory sub 64 to set logging parameters and collect logging information from the one or more logging tools 65 such as an NMR logging tool. Surface computer system 66 is preferably configured by software (shown in FIG. 3 in the form of removable storage media 72) to monitor and control downhole instruments 64, 65. System 66 includes a display device 68 and a user-input device 70 to enable a human operator to interact with the system control software 72.

In each of the foregoing logging environments, the logging tool assemblies preferably include a navigational sensor package that includes direction sensors for determining the inclination angle, the horizontal angle, and the rotational angle (a.k.a. "tool face angle") of the bottom hole assembly. As is commonly defined in the art, the inclination angle is the deviation from vertically downward, the horizontal angle is the angle in a horizontal plane from true North, and the tool face angle is the orientation (rotational about the tool axis) or angle from the high side of the wellbore. In accordance with known techniques, wellbore directional measurements can be made as follows: a three-axis accelerometer measures the earth's gravitational field vector relative to the tool axis and a point on the circumference of the tool called the "tool face scribe line". (The tool face scribe line is typically drawn on the tool surface as a line parallel to the tool axis.) From this measurement, the inclination and tool face angle of the bottom hole assembly can be determined. Additionally, a three-axis magnetometer measures the earth's magnetic field vector in a similar manner. Or gyro sensors can be used to measure angular velocity. From the combined gyro, magnetometer and accelerometer data, the horizontal angle of the bottom hole assembly may be determined. A motion sensing unit can also be included to track the position of the tool. In many cases, the motion sensing unit can derive the position information from the direction sensors.

Figure 4:
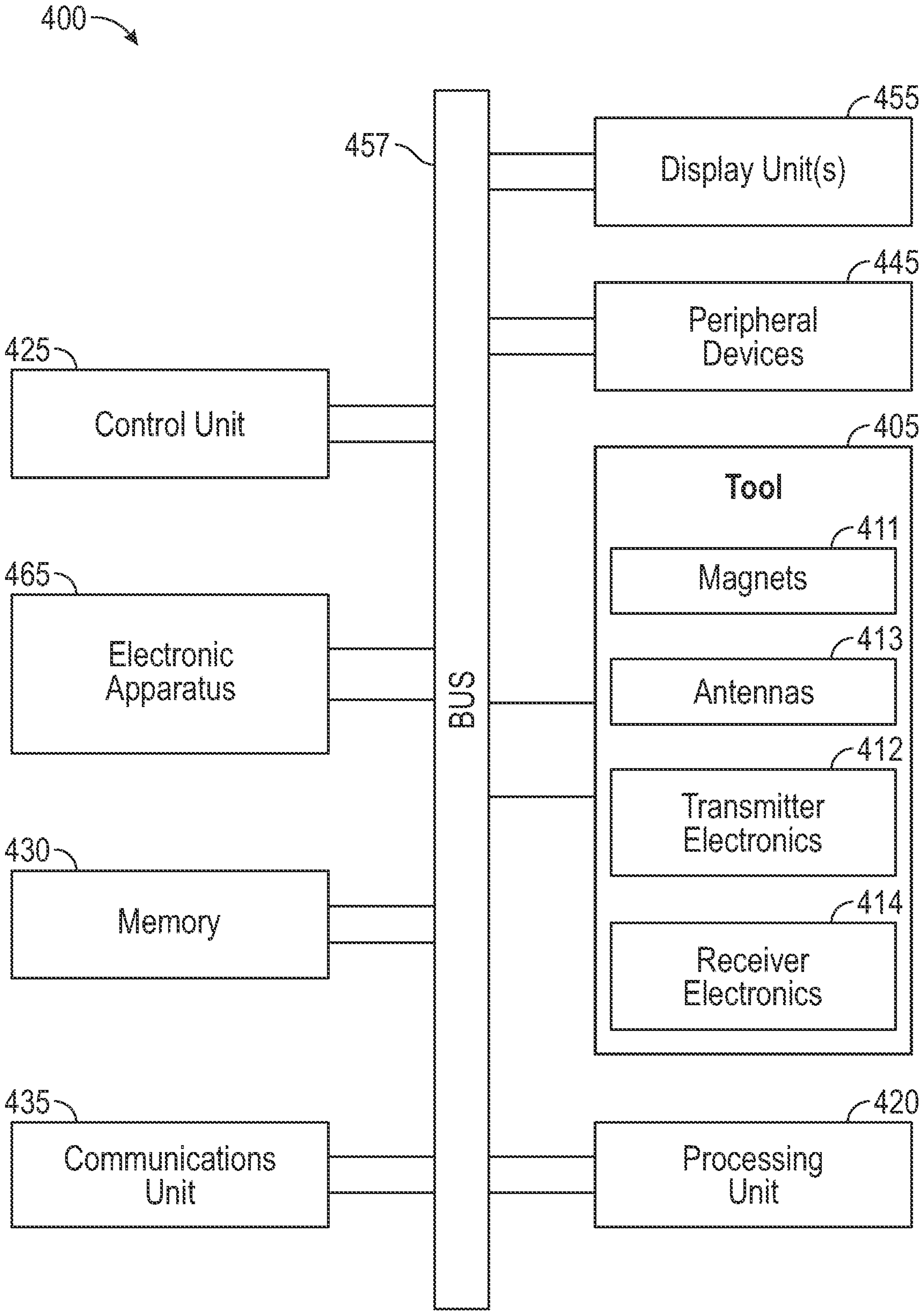
FIG. 4 is a block diagram of features of an example embodiment of a system operable to process nuclear magnetic resonance data.

FIG. 4 is a block diagram of features of an example embodiment of a system operable to process nuclear magnetic resonance data. The system 400 can include the NMR tool 405 having an arrangement of magnets 411, antenna(s) 413, transmitter electronics 412, and receiver electronics 414. The system 400 can be configured to operate in accordance with the teachings herein.

The system 400 can include a control unit 425, a memory 430, an electronic apparatus 465, and a communications unit 435. The memory 430 can be structured to include a database. The control unit 425, the memory 430, and the communications unit 435 can be arranged to operate as a processing unit to control operation of the transmitter electronics 412 and the receiver electronics 414 and to perform operations on the signals collected by the receiver electronics 414 to process nuclear magnetic resonance data generated by the NMR logging tool 405. A processing unit 420, structured to process nuclear magnetic resonance data of the NMR logging tool 405, can be implemented as a single unit or distributed among the components of the system 400 including electronic apparatus 465. The control unit 425 and the memory 430 can operate to control activation of the transmitter electronics 412 to generate echo train sequences and recovery pulses. The control unit 425 and the memory 430 can operate to control selection of the receiver electronics 414 in the tool 405 and to manage processing schemes. The control unit 425, the memory 430, and other components of the system 400 can be structured, for example, to operate similar to or identical to the components discussed herein or similar to or identical to any of methods discussed herein.

The system 400 can also include a bus 457, where the bus 457 provides electrical conductivity among the components of the system 400. The bus 457 can include an address bus, a data bus, and a control bus, each independently configured or in an integrated format. The bus 457 can be realized using a number of different communication mediums that allows for the distribution of components of the system 400. Use of the bus 457 can be regulated by the control unit 425. Bus 457 can include a communications network.

In various embodiments, the peripheral devices 445 can include additional storage memory and other control devices that may operate in conjunction with the control unit 425 and the memory 430. In an embodiment, the control unit 425 can be realized as a processor or a group of processors that may operate independently depending on an assigned function. The system 400 can include display unit(s) 455, which can be used with instructions stored in the memory 430 to implement a user interface to monitor the operation of the tool 405 or components distributed within the system 400.

The components shown in FIG. 4 need not be distributed as shown. Some of the components may be located on the surface, some in the tool 405, some in other locations in the drill string 8, wireline logging tool 34, logging tools 65, or some other location in the systems illustrated in FIGS. 1, 2, and 3, and some may be distributed among those locations.

In view of the foregoing, multifrequency NMR logging instruments acquire data in several sensitive volumes. The location of the sensitive volume is determined by the magnetic field, the antenna design, and the operation frequency. For multifrequency operation, each frequency corresponds to a sensitive volume. Multifrequency NMR logging tools generally are configured such that the magnetic field strength, $B_0$, is a function of r, (r is the distance between the front of the NMR logging tool surface to the center of the sensitive volume) and decrease monotonically as the distance from the tool surface increases. Since NMR resonance occurs when the operation frequency, $f_0$ is at the Larmor precession frequency, $f_L$, and the relationship between Larmor frequency and the magnetic field strength is:

$$f_L(r) = \gamma B_0(r), \tag{1}$$

where, $\gamma$ is the gyromagnetic ratio of proton.

So by selecting different operating frequencies, $f_{0i}$, protons in the volume at the location $r_{0i}$ where the magnetic field is substantially close to $B_0(r_{oi})$ reaches resonance condition. As $B_0(r)$ is a continuous function of r, and each sensitive volume has a finite width and shape, the magnetic field strength is not uniform within the sensitive volume, therefore the magnetic field gradient, which is defined as:

$$G(r) = -\frac{dB_0(r)}{dr} \tag{2}$$

is also a continuous varying function of r, meaning that for a finite thickness of a sensitive volume, within the sensitive volume, the gradient is also not a constant. Here, d is a differential operator.

The above description is a simplified version which assumes the sensitive volume is azimuthally symmetric, and $B_0$ and G is uniform along the tool's longitudinal direction. This azimuthal symmetry is only a valid approximation for a mandrel tool design, and the longitudinal uniformity requires the length of the antenna substantially large than it lateral dimension, which often is not used practically.

A side-looking NMR logging instrument, which gained popularity as a wireline NMR logging sensor configuration choice due to its multifrequency operation capability and its flexibility to operate in a wide range of wellbore diameters, has a more complicated magnetic field and gradient distribution. So Eqs. (1) and (2) need to be generalized to:

$$f_L(x, y, z) = \gamma B_0(x, y, z) \tag{3}$$

and $$G(x) = -\frac{\partial B_0(x, y, z)}{\partial x},\ G(y) = -\frac{\partial B_0(x, y, z)}{\partial y},\ G(z) = -\frac{\partial B_0(x, y, z)}{\partial z}, \tag{4}$$

respectively. Here, x and y are the Cartesian coordinates on the lateral plane particularly to the antenna in a sensitive volume, and z is the longitudinal coordinate of the same location in the sensitive volume.

Figure 5:
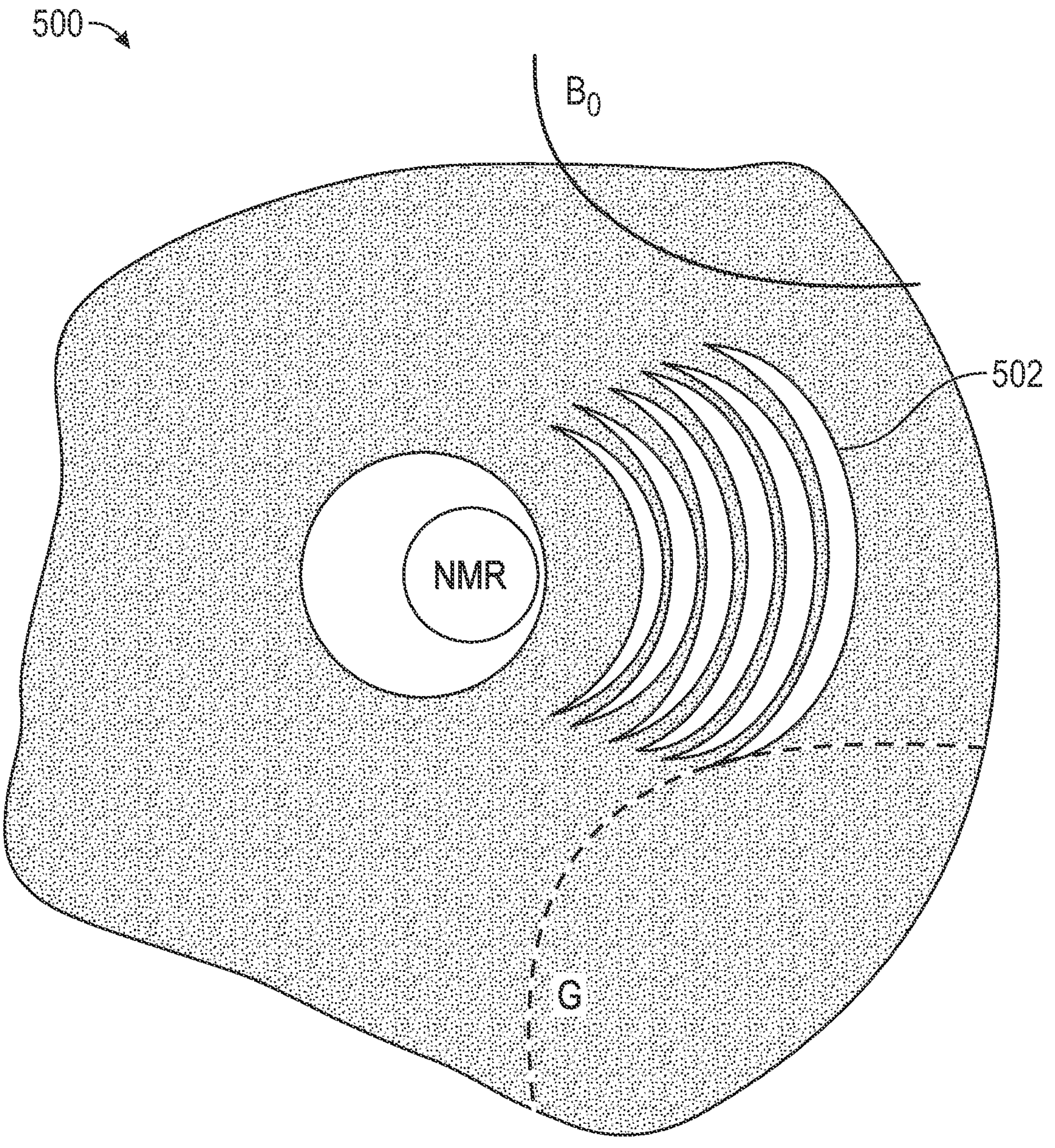
FIG. 5 is a cross section view of a typical sensitive volume shape at the center of the sensitive volume, according to certain illustrative embodiments of the present disclosure.

FIG. 5 is a cross section view of a typical sensitive volume shape at the center of the sensitive volume, according to certain illustrative embodiments of the present disclosure. The cross section of a sensitive volume shape 502 is approximately a crescent shape with thickest width in the middle, although the real shape could be somewhat departed from an ideal crescent shape and each sensitive volume may have different shape functions. Further, FIG. 5 also shows the magnetic field strength and gradient as a function of depth of investigation for a side-looking NMR logging instrument.

The thickness of a sensitive volume is defined by frequency selection, which is controlled by the field gradient, RF pulse width, shape, amplitude, and transmitter and antenna response functions, among others. When all other factors are the same, a crescent shape sensitive volume implies the magnetic field gradient is larger at the side tips than that at the center. Thus, it is quite clear the magnetic field gradient inside a sensitive volume is non-uniform.

The transfer functions of the RF circuit and transmitter may distort RF pulses in the sensitive volume regions, and subsequently modify the sensitive volume shape defined by the sensor configuration and ideal RF pulse realization. This may further complicate accuracy in spin dynamics modeling of the NMR response.

Figure 6:
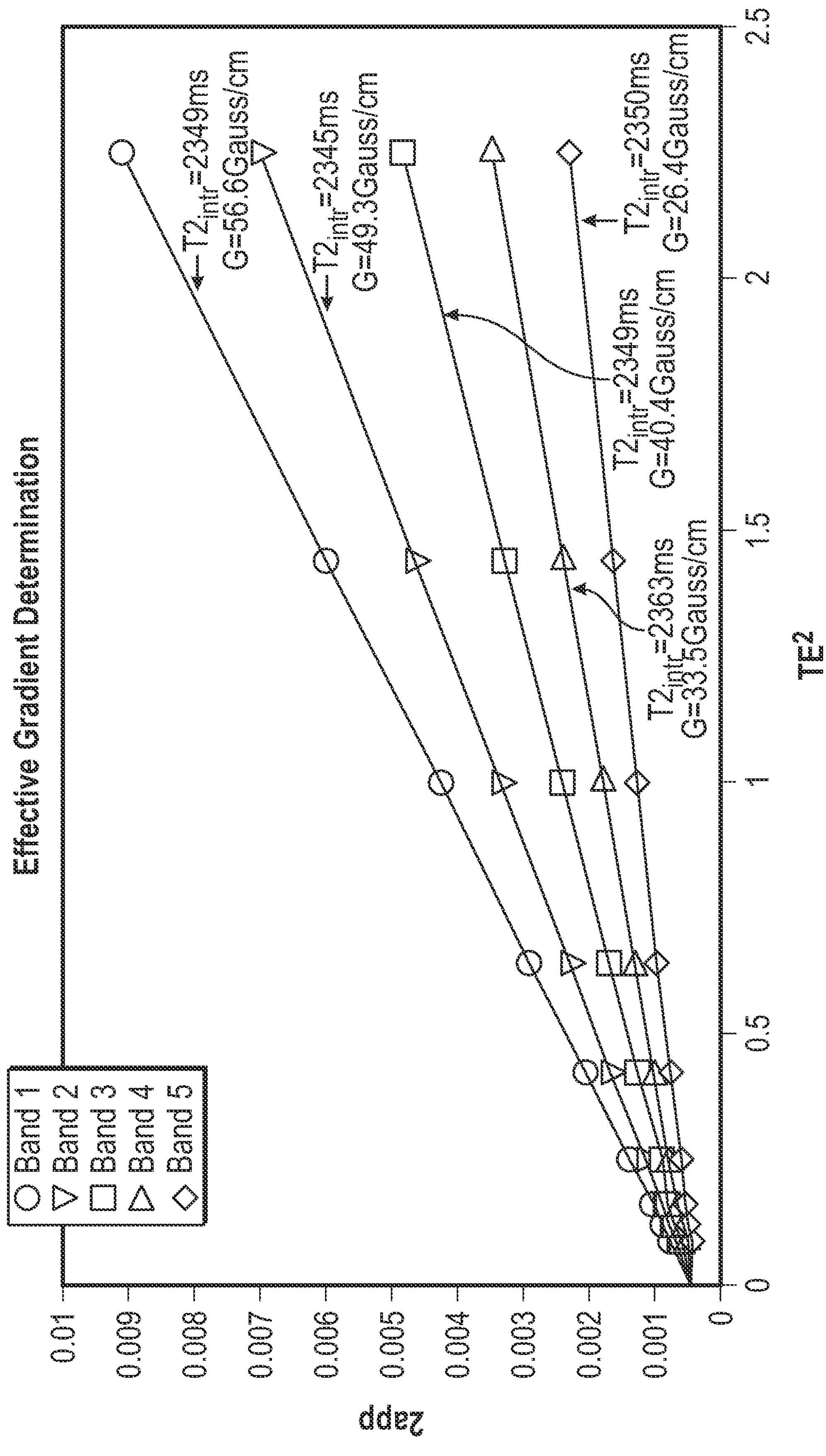
FIG. 6 is a graph showing an example of deriving effective gradient of each sensitive volume using a fluid tank, according to certain illustrative embodiments of the present disclosure.

As mentioned previously, typical conventional approaches approximate the gradient distribution with an "effective" or "averaged" gradient value per sensitive volume. The effective gradient can be experimentally derived from a calibration tank filled with a fluid. FIG. 6 is a graph showing an example of deriving effective gradient of each sensitive volume using a fluid tank, according to certain illustrative embodiments of the present disclosure. In FIG. 6, the x axis is $T_E^2$ and the y axis is the apparent $T_2$ relaxation rate ($1/T_{2app}$). The data are acquired with a set of $T_E$ values. The relaxation rates are plotted against the $$T_E^2.$$

The effective gradient value of a sensitive volume is derived from the slope. Since:

$$\frac{1}{T_{2,app}} = \frac{1}{T_{2intrinsic}} + \frac{\gamma^2 (G \cdot T_E)^2 \cdot D}{12} \tag{5}$$

for a tank fluid, plotting the apparent relaxation time rate, $$\frac{1}{T_{2,app}}$$

vs $$T_E^2$$

yields the gradient value G from the slope. Here, D is fluid diffusivity], $T_{2,app}$ is apparent transverse relaxation time without gradient distortion, and $T_{2intrinsic}$ is intrinsic transverse relaxation time.

The effective gradient or averaged gradient values are then used to interpret NMR logging data. For instance, in the inversion process, which transforms the time-domain echo decay data to be the parameter domain $T_1$, $T_2$, and/or diffusivity distribution, uses such approximation in the inversion matrix coefficients. Such approximation is tolerable when the gradient and $T_E$ values are small, but may cause distortion in relaxation time distribution for 1D inversion, and may result in inaccurate fluid typing and pore typing with 1D, 2D, and/or 3D inversion, if the gradient value is high, such as that with XMR tool.

Figure 7:
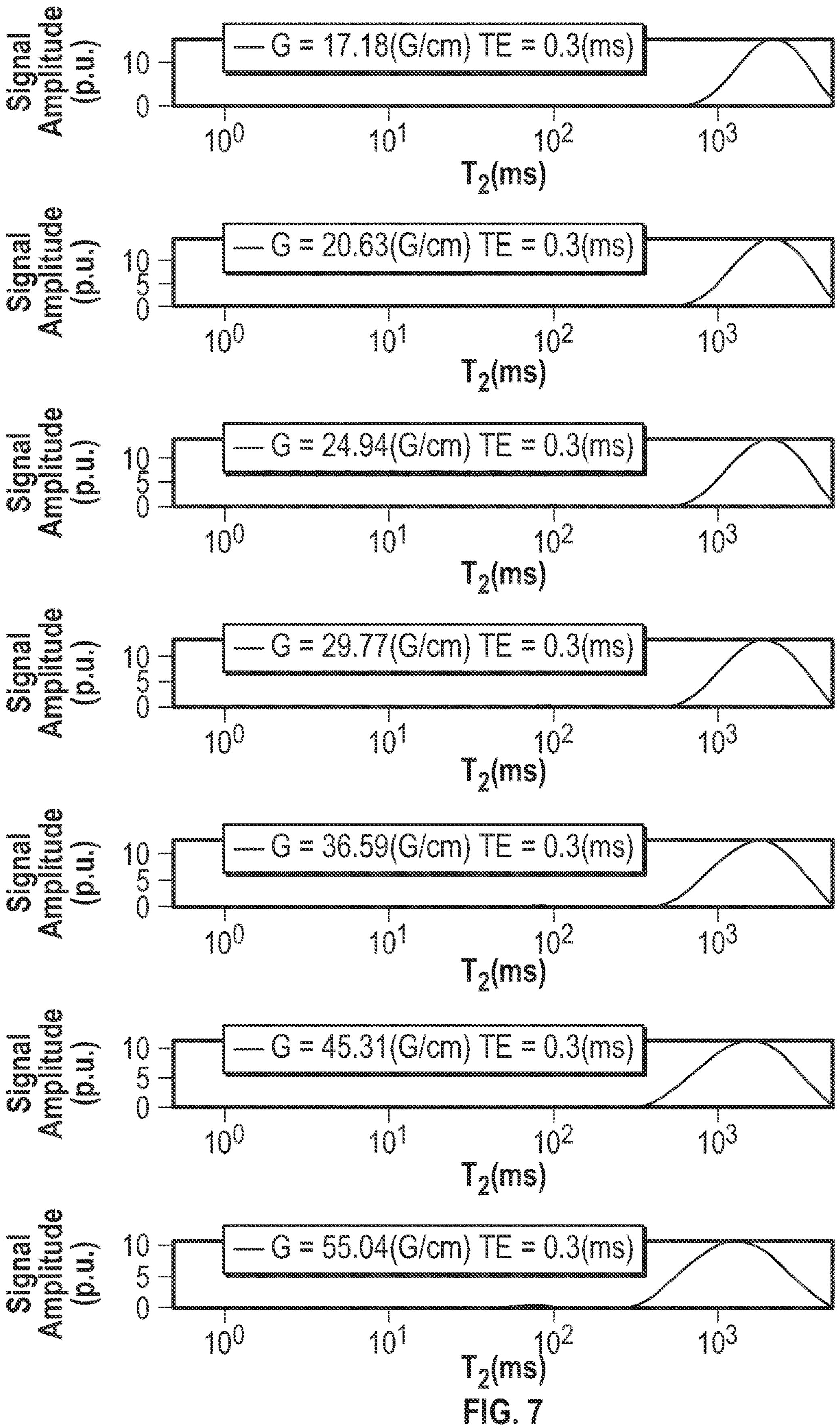
FIGS. 7 and 8 are graphs illustrating the difference in the derived $T_2$ distributions of a 2.4s $T_{2intrinsic}$ calibration tank fluid from two sets of measurements with different TE values.
Figure 8:
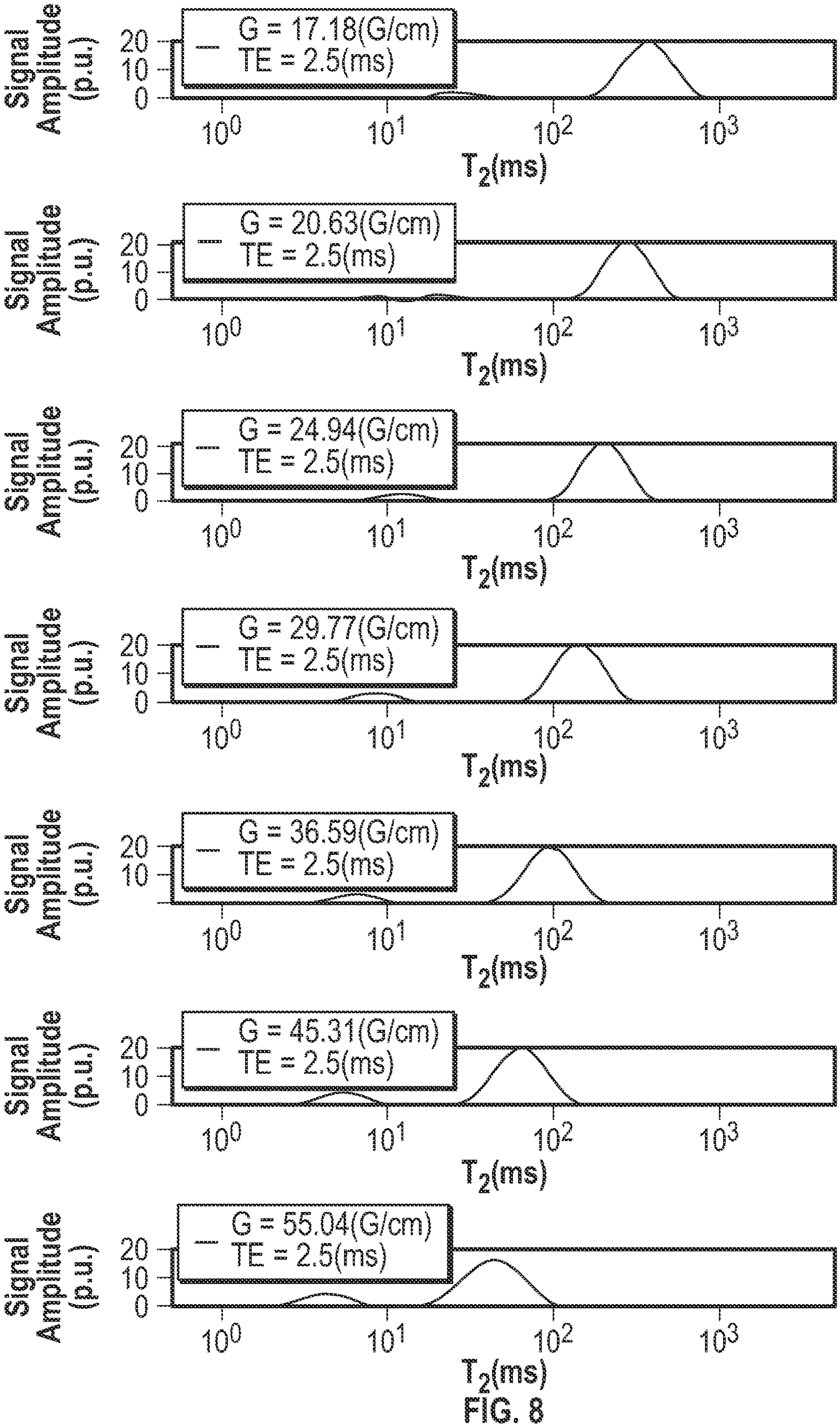
Figure 9:
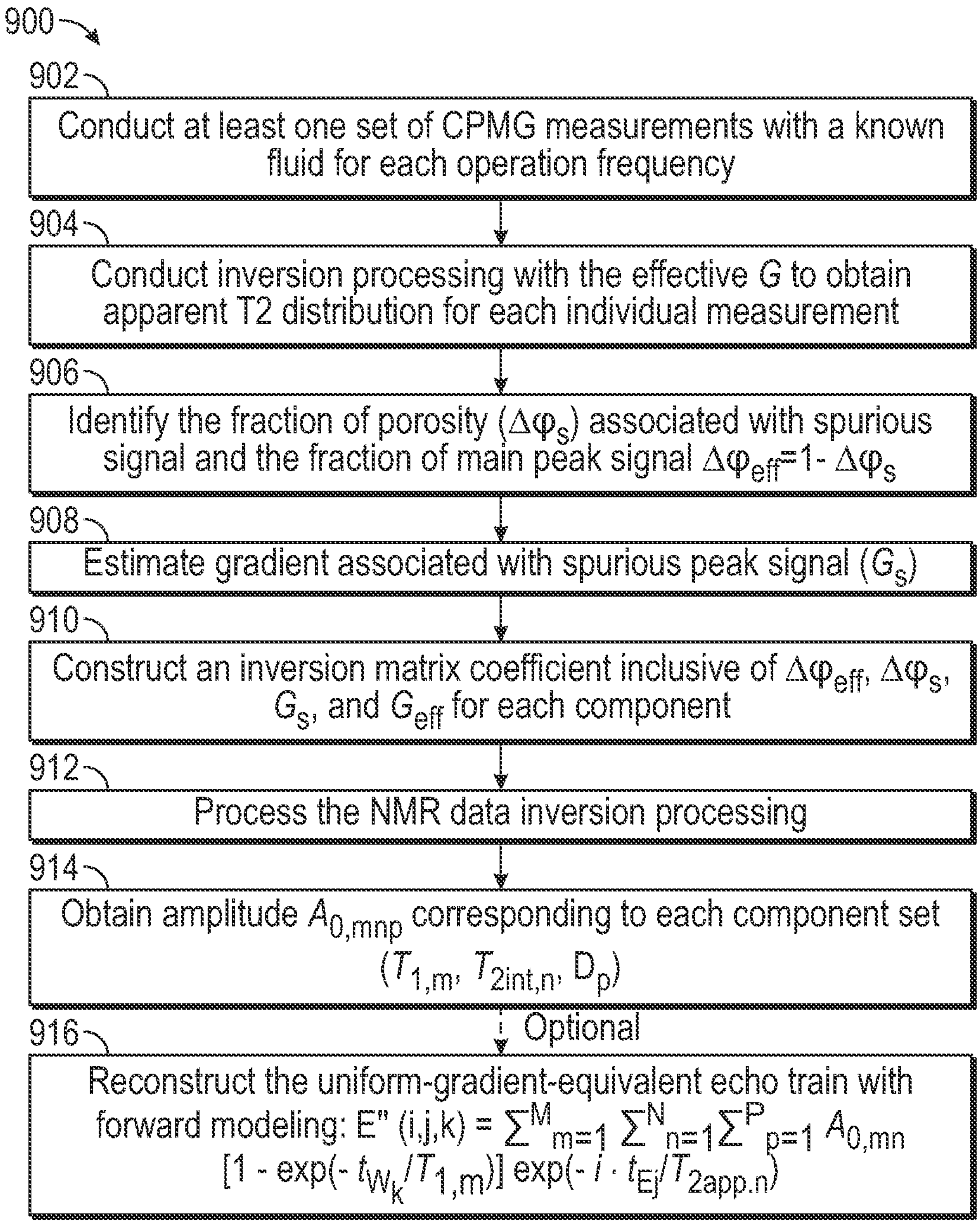
FIGS. 9, 10, 11, 12 and 13 are various methods for correcting distortions in gradient distributions, according to illustrative methods of the present disclosure.

FIGS. 7 and 8 are graphs illustrating the difference in the derived $T_2$ distributions of a 2.4s $T_{2intrinsic}$ calibration tank fluid from two sets of measurements with different $T_E$ values. In FIG. 9, the $T_2$ distributions are derived from echo trains acquired with the same 0.3 ms $T_E$, but different sensitive volumes. The underlying fluid is a tap water at ambient temperature. The relaxation time should be monomodal without a distribution of gradient. Each sensitive volume's gradient value and its distribution are different. With a short $T_E$ of 0.3 ms, the effect is not very significant.

From top to bottom in each of these figures, the data are derived from echo trains of seven sensitive volumes corresponding to lowest (top) to highest (bottom) frequencies. The highest frequency corresponds to the highest gradient value and vice versa. For the tank fluid, the distortion appears in $T_2$ spectra as departing from a mono-modality pattern. When $T_E$ value is small, the distortion is relatively insignificant, as the mono-modality is largely preserved FIG. 7. When the $T_E$ value is large, the departure from mono-modality becomes more pronounced, as seen in FIG. 9, where a second peak (i.e., spurious signal) appears at shorter relaxation time region versus the main peak.

In FIG. 8, the $T_2$ distributions are derived from echo trains acquired with a 2.5 ms $T_E$, for several sensitive volumes. The underlying fluid is a tap water at ambient temperature. With a long $T_E$ of 2.5 ms, the gradient distribution effect on the CPMG decay becomes significant—noticeably the second hump (i.e., spurious signal) on the left. Since the relaxation time should be a single exponential without a distribution of gradient, i.e., a would-be single exponential becomes non-single exponential decay. After inversion, the gradient distorted apparent $T_2$ distribution appears bimodal. To distinct the gradient distorted apparent $T_2$ distribution from the apparent $T_2$ distribution that is not subject to gradient distribution distortion, we define the symbol $T_{2apparent}$ for the former and $T_{2app}$ for the latter. Each sensitive volume's gradient value and its distribution are different. The top plot in FIG. 8 corresponds to a lower gradient sensitivity volume; thus, it is close to a monomodal. The bottom one corresponds to the highest gradient sensitive volume; the bimodality is more eminent.

Compare the $T_2$ distributions corresponding to data acquired at different gradients (different sensitive volumes) in FIG. 8, it is clear the distortion (i.e., spurious signal) due to gradient distribution is stronger when gradient is high, even if $T_E$ is the same, which is obvious from Eq. (5) as the decay rate is affected by the product of G and $T_E$.

Further, this problem of the spurious signal is also dependent upon underlying $T_{2intrinsic}$ distribution of the fluid, the diffusivity, and acquisition parameter settings (e.g., frequency), and is most significant for slow-relaxing formation and high diffusivity fluid at high interecho time setting. Thus, the effect becomes more significant for vuggy carbonate formation where the relaxation time is long.

The effective gradient values explain the shift of the main peak of the apparent $T_2$ distributions in FIGS. 7 and 8. Thus, the effective gradient can very well interpret the main peak. However, the smaller, secondary spurious peak cannot be explained by the effective gradient, that may potentially cause fluid typing interpretation error. If one can correct the spurious peak to include that to the main peak, then the data can be interpreted without bias using the effective gradient.

Therefore, in view of the foregoing, the present disclosure is focused on addressing this need of correcting the apparent $T_2$ distortion by effectively moving the spurious peak to the main peak such that the effective gradient can be used to interpret all signals. To say it another way, using the methods herein, the distortion of the apparent $T_2$ distribution is corrected by integrating the spurious signal peak into the main peak signal.

In a first illustrative method, by reexamining Eq. (5), one can see that each spurious $T_2$ peak corresponds to a different gradient value, departing from effective gradient, $G_{eff}$, by $\Delta G$ (i.e., the amount that causes the spurious signal peak deviating from the main signal peak) and the spurious signal position depends on measurement parameters: frequency (thus $G_{eff}$) and $T_E$, the underlying fluid properties, D and $T_{2intrinsic}$, both may not be single values but a distribution, in porous rock media and for multiple fluid phases within its pore space. Note that $\Delta G$ is frequency dependent. So, Eq. (5) can be rewritten as:

$$\frac{1}{T_{2,app,spurious}} = \frac{1}{T_{2,intrinsic}} + \frac{\gamma^2 ((G_{eff} + \Delta G) \cdot T_E)^2 \cdot D}{12} \tag{6}$$

The distributions of the intrinsic $T_2$ and diffusivity may fully or partially overlap with the main peak and the spurious peak of the apparent $T_2$ distribution, thus directly correcting from apparent $T_2$ spectra is not practically possible, without prior knowledge of $T_{2intrinsic}$ (abbreviated by $T_{2int}$, and D distributions, which are the unknowns to be determined).

Accordingly, the first illustrative method of the present disclosure is a method that estimates $\Delta G$ from the spurious signal on a gradient distribution distorted $T_{2apparent}$ distribution. The fraction of porosity ($\Delta\phi_s$) of the spurious signal is obtained by integrating the area beneath the spurious signal distribution. Because $\Delta G$ is derived from specific measurement, and the exact position of the spurious $T_{2apparent}$ peak may be affected by data acquisition quality and inversion artifact, it is best estimated from the measurement that employed a long $T_E$ value. Alternatively, $\Delta G$ may also be derived from multiple data acquisitions with the same or different $T_E$ values to obtain an average of the $\Delta G$ value. In other words, we approximate the gradient distribution within a sensitive volume with dual gradient values $G_{eff}$ and $G_S=G_{eff}+\Delta G$, with the corresponding porosity being $\Delta\phi_{eff}=1-\Delta\phi_s$ and $\Delta\phi_s$, respectively. Under this dual gradient value approximation, each has a fixed fraction of porosity. If the dual gradient approximation is a good approximation, it shall remain unchanged by fluid properties and by data acquisition parameter $T_E$. Therefore, in the inversion processing of the echo trains in this method, the part of the inversion matrix governing the diffusion decay should include two terms, as follows:

$$E(i,j,k)=\sum_{m=1}^{M}\sum_{n=1}^{N}\sum_{p=1}^{P}\left[1-\exp\left(-t_{W_k}/T_{1,m}\right)\right]\exp\left(-i\cdot T_{E_j}/T_{2int,n}\right)\left\{A_{0,mnp}\Delta\phi_{eff}\exp\left(-\gamma^2G_{l,eff}^2 i\cdot T_{E_j}^3D_p/12\right)+A_{0,mnp}\Delta\phi_s\exp\left(-\gamma^2G_{l,s}^2 i\cdot T_{E_j}^3D_p/12\right)\right\}+\text{noise}. \tag{7}$$

where E is the echo amplitude, i is the $i^{th}$ echo idex, j is $j^{th}$ $T_E$ index, M is the number of $T_1$ bins, m is the $T_1$ bin index, N is the number of $T_2$ bins, n is the $T_2$ bin index, P is the number of D bins, p is the D bin index, $t_W$ is wait time, k is the index for $k^{th}$ wait time, and $G_{l,eff}$ is $l^{th}$ sensitive volume effective gradient.

The amplitude of the porosity component $A_{0,mnp}$ corresponding to ($T_{1,m}$, $T_{2int,n}$, $D_p$) can be obtained by [from Eq. (7)]. Once $A_{0,mnp}$ is obtained, $T_{2int}$ distribution can be readily constructed, and the apparent $T_2$ distribution ($T_{2app}$) corresponding to $G_{l,eff}$ can be obtained by modeling the echo train using:

$$E'(i,j,k)=\sum_{m=1}^{M}\sum_{n=1}^{N}\sum_{p=1}^{P}\left[1-\exp\left(-t_{W_k}/T_{1,m}\right)\right]\exp\left(-i\cdot t_{Ej}/T_{2int,n}\right)\left\{A_{0,mnp}\exp\left(-\gamma^2G_{l,eff}^2 i\cdot t_{E_j}^3D_p/12\right)\right\}, \tag{8}$$

followed by an inversion of echo train E' with the kernel coefficient described by:

$$E''(i,j,k)=\sum_{m=1}^{M}\sum_{n=1}^{N}A_{0,mn}\left[1-\exp\left(-t_{W_k}/T_{1,m}\right)\right]\exp\left(-i\cdot t_{Ej}/T_{2app,n}\right), \tag{9}$$

where $T_{2app,n}$ is the $n^{th}$ apparent $T_2$ bin.

The above general description is for the most general case of three-dimensional inversion. However, those ordinarily skilled in the art having the benefit of this disclosure may adapt it into lower dimension inversions. Also, for those same skilled artisans, the foregoing description may also extend the binary gradient approach to more than 2 gradient values, such as one effective gradient plus two gradient values with $G_{effective}+\Delta G_1$ and $G_{effective}+\Delta G_2$ with corresponding fractional porosities of $\Delta\phi_{s1}$ and $\Delta\phi_{s2}$, and $\Delta\phi_{s1}+\Delta\phi_{s2}+\Delta\phi_{eff}=1$.

FIG. 9 is a flow chart of this first method described above to generate a model to correct gradient distribution distortions and to apply that model to correct NMR data, according to certain illustrative methods of the present disclosure. At block 902 of method 900, an NMR tool is used to obtain one or more sets of CPMG measurements with a known fluid for each operating frequency. At block 904, the system performs inversion processing with the effective gradient to obtain the apparent $T_2$ distribution for each individual measurement. At block 906, the system identifies the fraction of signal amplitude (porosity) associated with the spurious signal and the fraction of signal amplitude (porosity) of the main peak signal. The signal amplitude is proportional to porosity. At block 908, the gradient associated with the spurious peak signal is then determined. At block 910, an inversion coefficient matrix is constructed with is inclusive of the fraction of signal amplitude of the spurious peak, the fraction of signal amplitude of the main peak, the gradient associated with the spurious peak, and the effective gradient. This inversion matrix is the model which now can be used to correct the distortions of the gradient data.

At block 912, subsequent NMR data has been obtained, the matrix is generated and the matrix data are inverted. At block 914, inversion processing of the matrix is performed to obtain a reconstructed apparent $T_2$ distribution using the amplitude data in which the spurious signal peak has been integrated into the main peak, thus correcting the distortion. Optionally, at block 916, forward modeling may be performed in order to reconstruct the uniform-gradient-equivalent echo train.

Now a second illustrative method will be described. The first illustrative method described above includes an approximation which represents the gradient distribution in discrete few values with associated, fixed fractions of the signal intensities. While this method is computationally efficient, because the $T_2$ distribution spectral resolution is subject to inversion artifact and spectral resolvability, the resolution of the spurious $T_2$ peak from the main peak may not always be non-overlapping for some sensor configurations, and for some gradient distributions. For short $T_E$, and for fast relaxation and slow diffusion fluids in a rock, the spurious peak has a much smaller amplitude.

Like the first method, this second alternative method also uses two gradients. However, one of the gradients is an effective gradient, while the other gradient is floating with a constraint of:

$$G_c \le G_s \le G_{eff}, \tag{10}$$

where $G_c$ is a predetermined cutoff value which is estimated by a sensor simulation of gradient distribution. Thus, there is an upper and lower bound. The $\Delta\phi_s$ (signal amplitude associated with spurious peak) and $\Delta\phi_{eff}$ (signal amplitude associated with the main peak) can be either fixed, or floating, but always constrained by:

$$\Delta\phi_s+\Delta\phi_{eff}=1. \tag{11}$$

Equations (10) and (11) can be incorporated into the echo data inversion process to obtain a reconstructed $T_2$ distribution. In certain illustrative embodiments, the inversion can include a single echo train or multiple echo trains for any given frequency.

Figure 10:
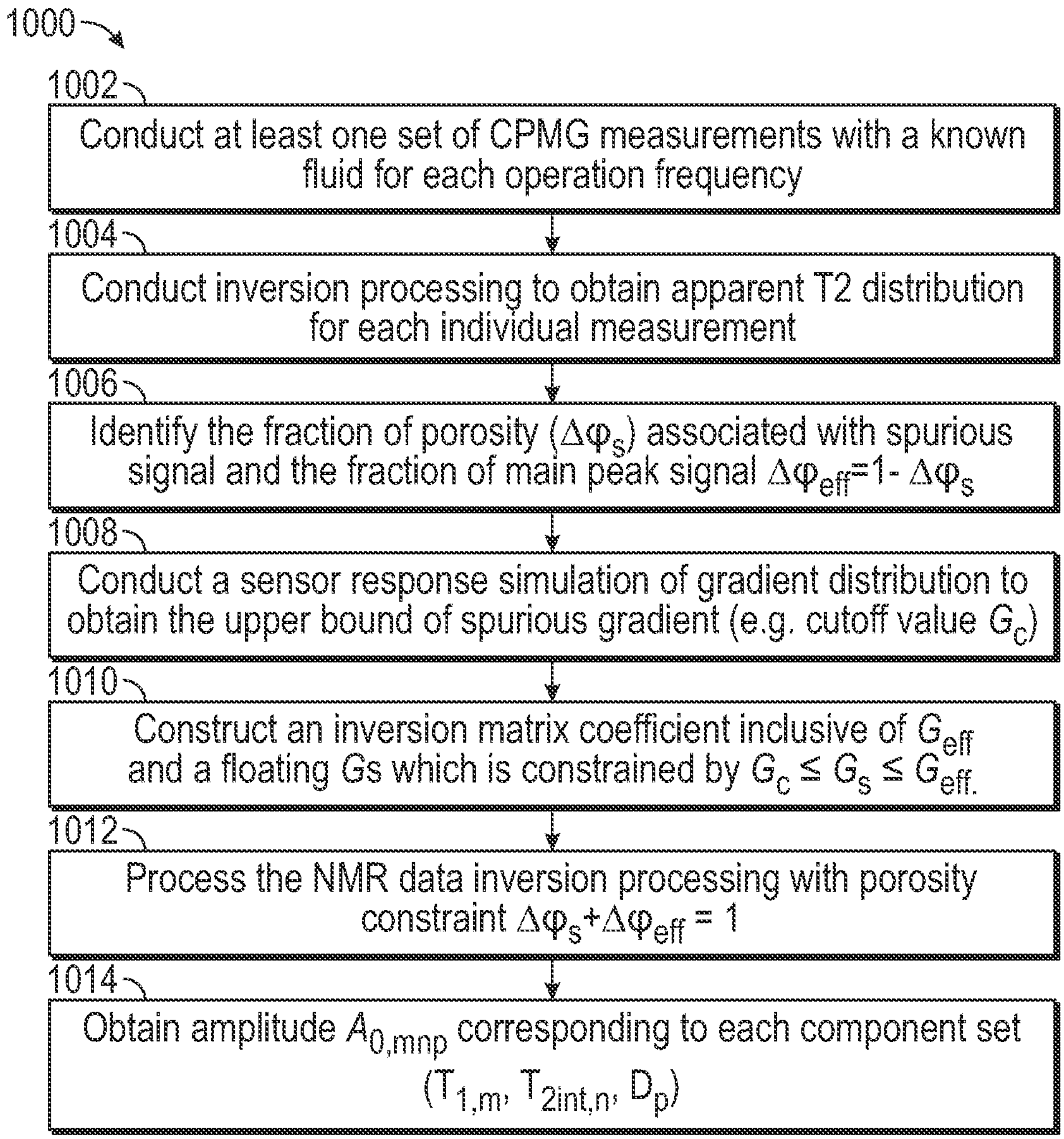

FIG. 10 is a flow of this second method which uses an effective and floating gradient to generate a model to correct the gradient distortions and apply that model to NMR data. In method 1000, at block 1002, an NRM tool is again used to obtain one or more sets of CPMG measurements with a known fluid for each operating frequency. At block 1004, the system performs inversion of the data to obtain the apparent $T_2$ distribution for each individual measurement. At block 1006, the system identifies the fraction of signal amplitude (porosity) associated with the spurious signal and the fraction of signal amplitude (porosity) of the main peak signal. The signal amplitude is proportional to porosity. At block 1008, a sensor response simulation of gradient distribution is conducted to obtain the upper bound of the spurious gradient (e.g., cutoff value $G_C$). At block 1010, an inversion coefficient matrix is constructed which is inclusive of the effective gradient and a floating gradient constrained by Equation 10. This inversion matrix is the model which now can be used to correct the distortions of the gradient data.

At block 1012, subsequent NMR data has been obtained and data inversion is performed using the porosity constraint of Equation 11 and the amplitude ($A_{0,mnp}$) is then obtained (at block 1214) for each component set ($T_{1,m}$, $T_{2int,n}$, $D_p$), to thereby generate a reconstructed apparent $T_2$ distribution which removes the distortion.

A third illustrative alternative method makes a minimal approximation on $G_S$ and $\Delta\phi_s$, although Eqns. (10) and (11) are still implied. The difference between this third method and the previous methods is this method allows the $G_S$ and $\Delta\phi_s$ to vary for different $T_E$, D, and $T_{2intrinsic}$ variables.

In this third method, experimental data and data at a known $T_E$, D, and $T_{2intrinsic}$ are acquired and the $G_s$ and $\Delta\phi_s$ are determined from experimentally derived $T_{2app}$ distributions as G, $T_E$, D, and $T_{2intrinsic}$ varies.

In certain illustrative methods, the experiments may include, but are not limited to, conducting repeated experiments in a calibration tank filled with a fluid with known D and $T_{2intrinsic}$ variables, then changing the fluid with a different set of D and $T_{2intrinsic}$ variables one at a time. The experiments may cycle through all frequencies, and for each frequency multiple TE data acquisition parameters are used. One way of varying different fluid $T_{2intrinsic}$ variables is by doping tap water with variable amounts of $CuSO_4$ or a relaxation rate enhancing agent such as $MnCl_2$. Another way of varying $T_{2intrinsic}$ and D of fluids is by heating the fluids in a calibration tank to different temperatures. Yet another way of varying $T_{2intrinsic}$ and D is to use oil of different viscosities, one at a time, to fill a calibration tank.

Ideally, more variation of fluids of $T_{2intrinsic}$ and D provides a sufficient wide range of fluid property ranges that are encountered in diverse reservoirs. Practically, it is difficult, if not possible, to exhaust every possible combination to build a correction lookup table. Therefore, a machine learning based interpretation method is employed in this illustrative method to predict the correction matrix coefficients that can be incorporated in inversion process. One such as interpolation problem can be formulated with a multivariable problem involving ($G_{eff}$, $\Delta\phi_s$, $G_S$, $T_E$, D, and $T_{2intrinsic}$). The training data may use the available experimental data, using artificial neural network and deep neural network techniques to predict ($\Delta\phi_s$, $G_S$) for any missing data with a given ($G_{eff}$, $T_E$, D, and $T_{2intrinsic}$) On the other hand, an alternative method is to train the interpolation model using the experimentally measured apparent $T_2$ distribution that is subject to the distribution of gradient inside a sensitive volume, $P(T_{2apparent})$, with all the fluid and data acquisition parameters. Here, the training data sets may consist of $P(T_{2apparent})$, the $T_2$ distribution corresponding to the effective gradient $Q(T_{2,eff})$ as target, and $T_E$, D, and $T_{2intrinsic}$, and frequency f as inputs. The trained interpretation model is then used to predict $P(T_{2apparent})$ and $Q(T_{2,eff})$, for the missing data corresponding to the $T_E$, D, and $T_{2intrinsic}$, and frequency f where no experiment data are available.

With the $P(T_{2apparent})$ and $Q(T_{2,eff})$ predicted for any given f, $T_E$, D, and $T_{2intrinsic}$, one shall be able to construct a correction coefficient vector as follows:

$$\Lambda = Q(T_{2,eff}) / \|Q(T_{2,eff})\| / P(T_{2apparent}) / \|P(T_{2,apparent})\|, \tag{12}$$

where $\Lambda$ is a one dimensional vector, which can be integrated in the inversion kernel:

$$E''(i, j, k) = \sum_{m=1}^{M} \sum_{n=1}^{N} A_{0,mn} \cdot \Lambda_n \cdot \left[1 - \exp\left(-t_{W_k} / T_{1,m}\right)\right] \exp(-i \cdot T_{Ej} / T_{2app,n}) \tag{13}$$

for 1D inversion, and for 3D inversion, the corresponding equation is:

$$E(i, j, k) = \sum_{m=1}^{M} \sum_{n=1}^{N} \sum_{p=1}^{P} A_{0,mnp} \cdot \Lambda_n \cdot \left[1 - \exp\left(-t_{W_k} / T_{1,m}\right)\right] \exp(-i \cdot T_E / T_{2int,n}) \exp\left(-\gamma^2 G_{l,eff}^2 i \cdot T_{E_j}^3 D_p / 12\right). \tag{14}$$

The above description involves only the correction for a $T_2$ dimension. In certain embodiments, there should be no correction required for $T_1$ dimension because $T_1$ is independent of gradient. On the other hand, diffusivity can also be affected by the distribution of gradient inside a sensitive volume, therefore, the same model training and prediction method, and the formulation of the correction matrix coefficient, can be extended to include diffusivity dimension, as well as for both $T_2$ and D dimensions. In the latter case, the correction coefficient matrix becomes two dimensional:

$$\Lambda = Q'(D_{eff}, T_{2,eff}) / \|Q'(D_{eff}, T_{2,eff})\|_2 / P'(D_{apparent}, T_{2apparent}) / \|P'(D_{apparent}, T_{2apparent})\|_2 \tag{15}$$

Figure 11:
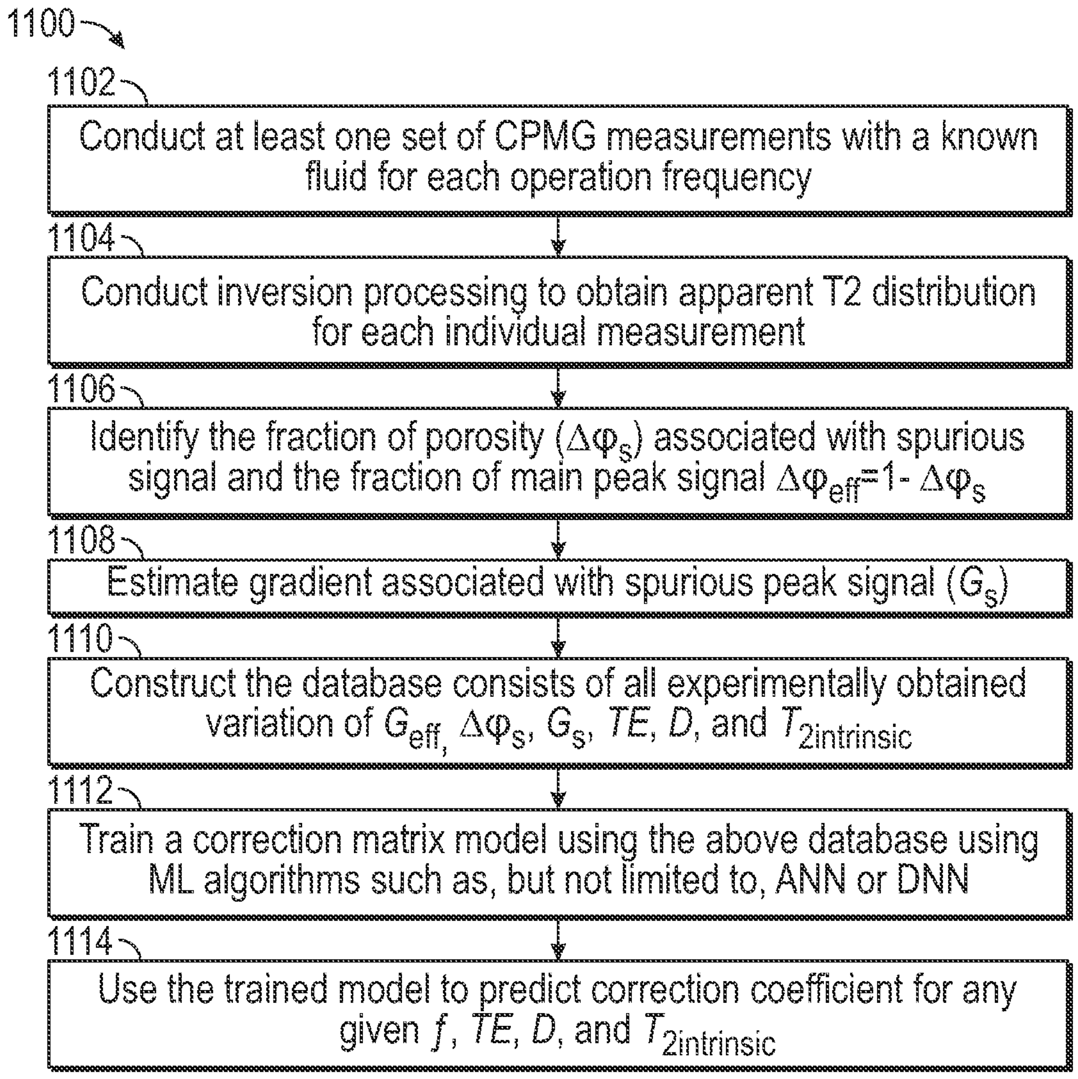

In view of the foregoing, FIG. 11 is a flow chart of the third method to generate a model to correct a gradient distribution and apply that model to NMR data, according to certain illustrative methods of the present disclosure. At block 1102 of method 1100, the system acquires one or more sets of CPMG measurements with a known fluid for each operation frequency. At block 1104, the data is inverted to obtain the apparent $T_2$ distribution for each individual measurement. At block 1106, the system identifies the fraction of signal amplitude (porosity) associated with the spurious signal and the fraction of signal amplitude (porosity) of the main peak signal. The signal amplitude is proportional to porosity. The measurements of blocks 1102-1106 are repeated with various fluids having different $T_2$ intrinsic and diffusivity attributes and viscosity. Each fluid measurement is repeated using multiple values of inter-echo spacing $T_E$.

At block 1108, the gradient associated with the spurious peak signal ($G_S$) is calculated. At block 1110, a database is constructed which consists of all experimentally obtained variations of the signal amplitude associated with the spurious peak ($\Delta\phi_s$), field gradient associated with the spurious signal ($G_S$), the effective gradient, spacing ($T_E$), fluid diffusivity (D), and intrinsic $T_2$relaxation time ($T_{2intrinsic}$). At block 1112, a correction matrix model is trained using the database of block 1110 using a machine learning technique such as, but not limited to, artificial neural networks or deep neural networks. The trained correction matrix is the model used to correct the distortion of NMR data.

At block 1114, subsequent NMR data is obtained and the trained correction matrix model is used to determine correction coefficients, for example, for a given f, TE, D, and $T_{2intrinsic}$ Thereafter, inversion processing is performed on the trained correction matrix model to obtain a reconstructed apparent $T_2$ distribution using the correction coefficients in which the spurious signal peak will be integrated into the main peak. As a result, the distortion is corrected.

Figure 12:
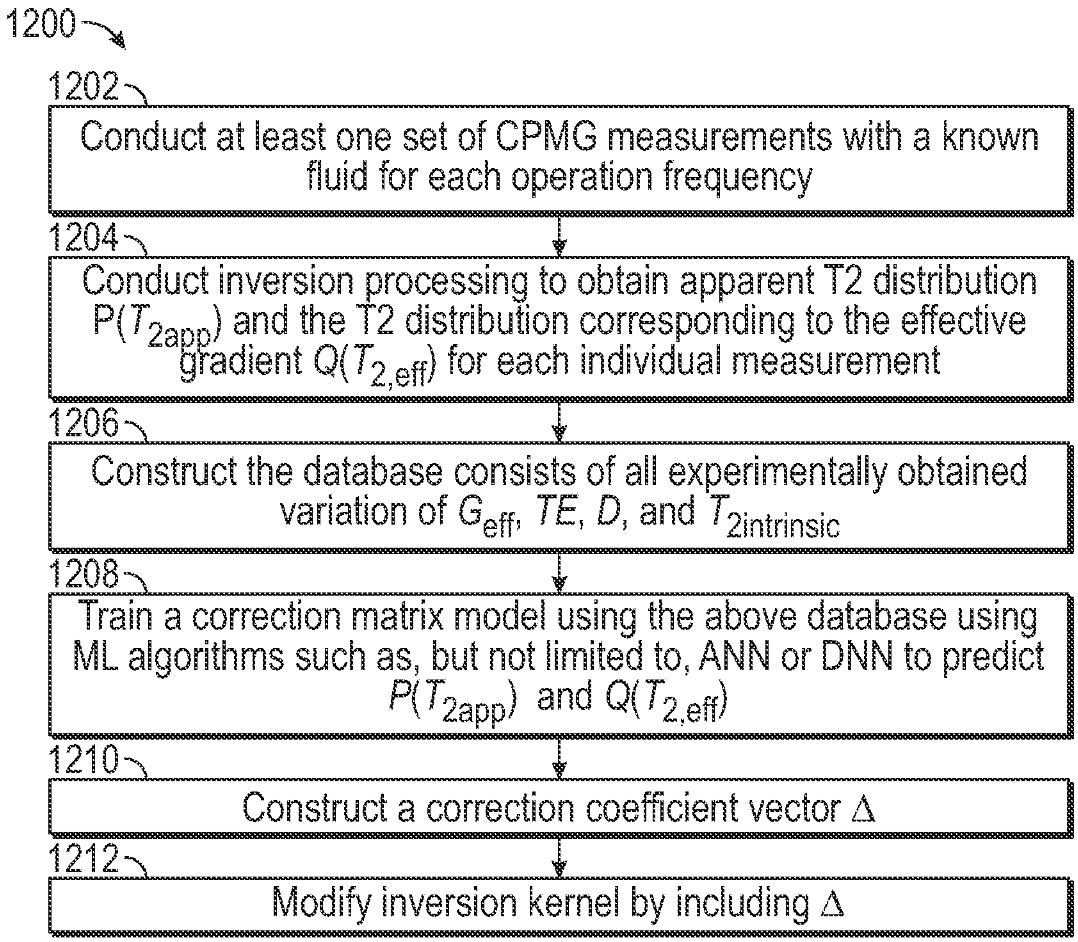

Also in view of the foregoing, FIG. 12 is a flow chart for a fourth alternative method to generate the model and correct a gradient distribution of NMR data, according to certain illustrative methods of the present disclosure. At block 1202 of method 1200, an NMR tool is used to obtain one or more sets of CPMG measurements with a known fluid for each operation frequency. At block 1204, the system performs inversion on the CPMG measurements to obtain the apparent $T_2$distribution $P(T_{2app})$ and the $T_2$distribution corresponding to the effective gradient $Q(T_{2,eff})$ for each individual measurement. The measurements of blocks 1202 and 1204 are repeated with various fluids having different $T_{2intrinsic}$ and diffusivity attributes and viscosity. Each fluid measurement is repeated using multiple values of inter-echo spacing $T_E$.

At block 1206, a database is constructed that consists of all experimentally obtained variations of $G_{eff}$, $T_E$, D, and $T_{2intrinsic}$. At block 1208, a correction matrix model is trained using the database of block 1406 using machine learning techniques such as, for example, artificial neural networks or deep neural networks to predict $P(T_{2app})$ and $Q(T_{2,eff})$. At block 1210, a correction coefficient vector is constructed. At block 1212, the inversion kernel is modified by including the correction coefficient vector. Thereafter, inversion processing of the trained correction matrix model is performed to obtain a reconstructed apparent $T_2$ distribution using the modified inversion kernel in which the spurious signal peak has been integrated main peak, thereby correcting the distortion.

Figure 13:
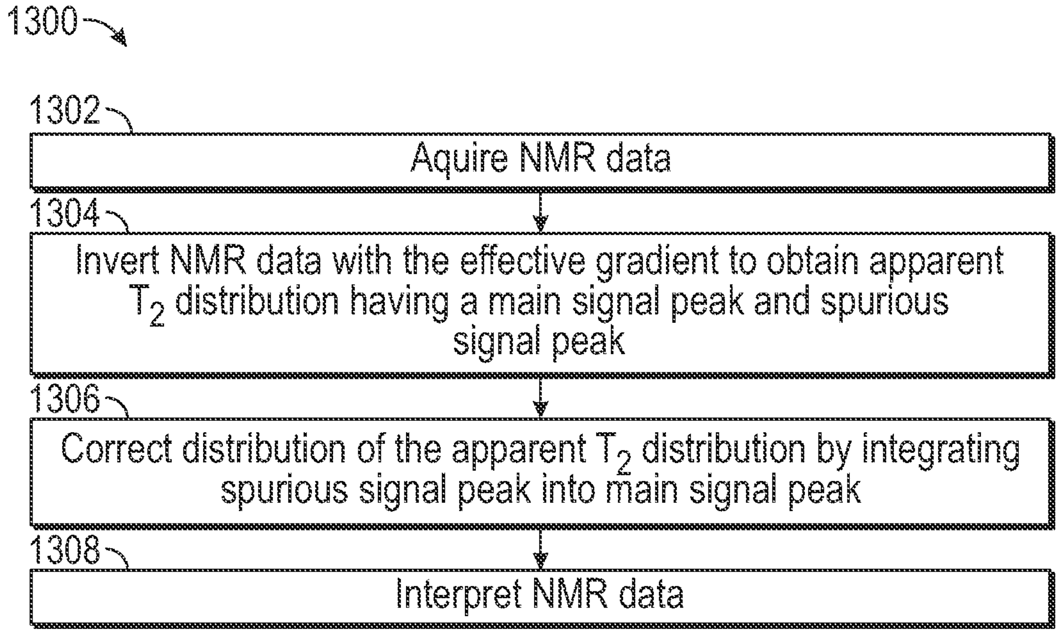

FIG. 13 is a flow chart of a generalized method to correct gradient distribution in downhole NMR logging, according to certain illustrative methods of the present disclosure. At block 1302 of method 1300, a logging tool positioned within a hydrocarbon bearing formation is used to acquire NMR data. At block 1304, inversion processing of the data is conducted using an effective gradient to obtain an apparent $T_2$distribution having a first main peak and a distortion caused by a second spurious peak. The first main peak corresponds to the effective gradient. At block 1306, the distortion of the apparent $T_2$distribution is corrected by integrating a signal corresponding to the spurious peak into a signal corresponding to the main peak, using any of the methods described herein. At block 1308, the NMR data is interpreted using the corrected apparent $T_2$ distribution and the effective gradient. The interpreted data is then used to determine characteristics of the formation such as, but not limited to permeability, pore size distribution, free and bound fluid volumes, micro, meso, and macro pore discrimination, or characteristics of fluid within the formation, such as, but not limited to, water and hydrocarbon volumes, saturations, and viscosity of the said fluids.

Accordingly, the illustrative methods described herein include two general approaches. The first approach approximates a gradient distribution by binary gradient values and uses experiment data to determine the binary gradient values and the corresponding signal strength for each sensitive volume in controlled fluid and experimental conditions. This model will then be integrated in the inversion kernel to eliminate the spurious signal caused by gradient distribution. The second approach combines laboratory experimental data on a fixed, limited number of fluids, together with forward modeling data, and machine learning techniques to predict the correction matrix coefficients for the entire application envelop, without making the binary gradient approximation. The correction matrix is integrated to the inversion kernel function. The resulting inversion kernel function replaces the original kernel function. These methods overcome the gradient distribution caused distortion and bias from NMR logging data, thereby yielding correct answers for bulk volume irreducible (BVI), pore typing, and fluid typing interpretation.

Embodiments and methods described herein further relate to any one or more of the following paragraphs:

1. A method to generate a model of an unknown magnetic field gradient distribution in a sensitive volume of a downhole nuclear magnetic resonance ("NMR") logging tool, the method comprising acquiring data measurements from operation of an NMR logging tool, the data being obtained in a media in which fluid properties are known; conducting inversion processing of the data to obtain an apparent T2 distribution for each data measurement; computing an effect of a gradient distribution in a sensitive volume on the apparent T2 distribution, an effective porosity fraction and a spurious porosity fraction; forming a gradient distribution having a spurious gradient and an effective gradient associated with the effective and spurious porosity fractions; and generating the model by modifying an inversion matrix to include the effective gradient, spurious gradient, effective porosity fraction and spurious porosity fraction.
2. The method as defined in paragraph 1, wherein the inversion processing conducted to obtain the apparent $T_2$ distributed is conducted with an effective gradient; and the spurious gradient is estimated.
3. The method as defined in paragraphs 1 or 2, wherein the spurious gradient is obtained by conducting a sensor response simulation of the gradient distribution.
4. The method as defined in any of paragraphs 1-3, wherein the spurious gradient included in the modified inversion matrix is constrained by an effective gradient and an upper bound gradient.
5. The method as defined in any of paragraphs 1-4, wherein the model is applied to process NMR logging data acquired in a subsurface rock formation media.
6. The method as defined in any of paragraphs 1-5, wherein fluid properties of the subsurface rock formation media are unknown.
7. A system comprising a nuclear magnetic resonance (NMR) logging tool; a control unit coupled to the NMR logging tool to control the NMR logging tool; and a downhole processor coupled to the NMR tool and the control unit to perform operations to: acquiring data measurements from operation of an NMR logging, the data being obtained in a media in which fluid properties are known; conducting inversion processing of the data to obtain an apparent T2 distribution for each data measurement; computing an effect of a gradient distribution in a sensitive volume on the apparent T2 distribution, an effective porosity fraction and a spurious porosity fraction; forming a gradient distribution having a spurious gradient and an effective gradient associated with the effective and spurious porosity fractions; and generating the model by modifying an inversion matrix to include the effective gradient, spurious gradient, effective porosity fraction and spurious porosity fraction.

8. The system as defined in paragraph 7, wherein: the inversion processing conducted to obtain the apparent T2 distributed is conducted with an effective gradient; and the spurious gradient is estimated.

9. The system as defined in paragraphs 7 or 8, wherein the spurious gradient is obtained by conducting a sensor response simulation of the gradient distribution.

10. The system as defined in any of paragraphs 7-9, wherein the spurious gradient included in the modified inversion matrix is constrained by an effective gradient and an upper bound gradient.

11. The system as defined in any of paragraphs 7-10, wherein the model is applied to process NMR logging data acquired in a subsurface rock formation media.

12. The system as defined in any of paragraphs 7-11, wherein fluid properties of the subsurface rock formation media are unknown.

13. A non-transitory computer program product including instructions which, when executed by at least one processor, causes the processor to a method comprising: acquiring data measurements from operation of an NMR logging tool, the data being obtained in a media in which fluid properties are known; conducting inversion processing of the data to obtain an apparent T2 distribution for each data measurement; computing an effect of a gradient distribution in a sensitive volume on the apparent T2 distribution, an effective porosity fraction and a spurious porosity fraction; forming a gradient distribution having a spurious gradient and an effective gradient associated with the effective and spurious porosity fractions; and generating the model by modifying an inversion matrix to include the effective gradient, spurious gradient, effective porosity fraction and spurious porosity fraction.

14. The computer program product as defined in paragraph 13, wherein the inversion processing conducted to obtain the apparent T2 distributed is conducted with an effective gradient; and the spurious gradient is estimated.

15. The computer program product as defined in paragraphs 13 or 14, wherein the spurious gradient is obtained by conducting a sensor response simulation of the gradient distribution.

16. The computer program product as defined in any of paragraphs 13-15, wherein the spurious gradient included in the modified inversion matrix is constrained by an effective gradient and an upper bound gradient.

17. The computer program product as defined in any of paragraphs 13-16, wherein the model is applied to process NMR logging data acquired in a subsurface rock formation media.

18. The computer program product as defined in any of paragraphs 13-17, wherein fluid properties of the subsurface rock formation media are unknown.

19. A method to generate a model of an unknown magnetic field gradient distribution in a sensitive volume of a downhole nuclear magnetic resonance ("NMR") logging tool, the method comprising acquiring data measurements from operation of an NMR logging tool, the data being obtained in a media in which fluid properties are known; conducting inversion processing of the data measurements to obtain an apparent T2 distribution for each data measurement; identify a spurious porosity fraction and effective porosity fraction of the apparent T2 distribution; compute a spurious gradient associated with the spurious porosity fraction; constructing a database including experimentally obtained variations of NMR data including at least one of the spurious gradient or an effective gradient; and generating the model by training, via machine learning, a correction matrix model using the database.

20. The method as defined in paragraph 19, wherein the experimentally obtained variations of NMR data comprise a signal amplitude associated with the spurious peak (Δϕ_s) obtained using acquisition parameters including echo spacing ($T_E$), frequency, fluid diffusivity (D), or intrinsic T2 relaxation time (T2intrinsic) of the known fluid properties.

21. The method as defined in paragraphs 19 or 20, wherein the model is applied to process NMR logging data acquired in a subsurface rock formation media.

22. The method as defined in any of paragraphs 19-21, wherein fluid properties of the subsurface rock formation media are unknown.

23. A system comprising a nuclear magnetic resonance (NMR) logging tool; a control unit coupled to the NMR logging tool to control the NMR logging tool; and a downhole processor coupled to the NMR tool and the control unit to perform operations to: acquiring data measurements from operation of an NMR logging tool, the data being obtained in a media in which fluid properties are known; conducting inversion processing of the data measurements to obtain an apparent T2 distribution for each data measurement; identify a spurious porosity fraction and effective porosity fraction of the apparent T2 distribution; compute a spurious gradient associated with the spurious porosity fraction; constructing a database including experimentally obtained variations of NMR data including at least one of the spurious gradient or an effective gradient; and generating the model by training, via machine learning, a correction matrix model using the database.

24. The system as defined in paragraph 23, wherein the experimentally obtained variations of NMR data comprise a signal amplitude associated with the spurious peak (Δϕs) obtained using acquisition parameters including echo spacing ($T_E$), frequency, fluid diffusivity (D) of the known fluid properties, or intrinsic T2 relaxation time (T2intrinsic) of the known fluid properties.

25. The system as defined in paragraphs 23-24, wherein the model is applied to process NMR logging data acquired in a subsurface rock formation media.

26. The system as defined in any of paragraphs 23-25, wherein fluid properties of the subsurface rock formation media are unknown.

27. A non-transitory computer program product including instructions which, when executed by at least one processor, causes the processor to a method comprising: acquiring data measurements from operation of an NMR logging tool, the data being obtained in a media in which fluid properties are known; conducting inversion processing of the data measurements to obtain an apparent T2 distribution for each data measurement; identify a spurious porosity fraction and effective porosity fraction of the apparent T2 distribution; compute a spurious gradient associated with the spurious porosity fraction; constructing a database including experimentally obtained variations of NMR data including at least one of the spurious gradient or an effective gradient; and generating the model by training, via machine learning, a correction matrix model using the database.

28. The computer program product as defined in paragraph 27, wherein the experimentally obtained variations of NMR data comprise a signal amplitude associated with the spurious peak ($\Delta\phi s$) obtained using acquisition parameters including echo spacing ($T_E$), frequency, fluid diffusivity (D) of the known fluid properties, or intrinsic T2 relaxation time (T2intrinsic) of the known fluid properties.

29. The computer program product as defined in paragraphs 27 or 28, wherein the model is applied to process NMR logging data acquired in a subsurface rock formation media.

30. The computer program product as defined in any of paragraphs 27-29, wherein fluid properties of the subsurface rock formation media are unknown.

31. A method to generate a model of an unknown magnetic field gradient distribution in a sensitive volume of a downhole nuclear magnetic resonance ("NMR") logging tool, the method comprising acquiring data measurements from operation of an NMR logging tool, the data being obtained in a media in which fluid properties are known; conducting inversion processing of the data measurements to obtain an apparent T2 distribution for each data measurement; conducting inversion processing of the data measurements to obtain T2 distribution corresponding to an effective gradient; constructing a database including experimentally obtained variations of NMR data; training, via machine learning, a correction matrix model using the database; using the trained correction matrix model to determine a correction coefficient vector; modifying an inversion kernel using the vector; and generating the model by training, via machine learning, a correction matrix model using the database.

32. The method as defined in paragraph 31, wherein the model is applied to process NMR logging data acquired in a subsurface rock formation media.

33. The method as defined in paragraphs 31 or 32, wherein fluid properties of the subsurface rock formation media are unknown.

34. A system comprising: a nuclear magnetic resonance (NMR) logging tool; a control unit coupled to the NMR logging tool to control the NMR logging tool; and a downhole processor coupled to the NMR tool and the control unit to perform operations to: acquiring data measurements from operation of an NMR logging tool, the data being obtained in a media in which fluid properties are known; conducting inversion processing of the data measurements to obtain an apparent T2 distribution for each data measurement; conducting inversion processing of the data measurements to obtain T2 distribution corresponding to an effective gradient; constructing a database including experimentally obtained variations of NMR data; training, via machine learning, a correction matrix model using the database; using the trained correction matrix model to determine a correction coefficient vector; modifying an inversion kernel using the vector; and generating the model by training, via machine learning, a correction matrix model using the database.

35. The system as defined in paragraph 34, wherein the model is applied to process NMR logging data acquired in a subsurface rock formation media.

36. The system as defined in paragraphs 34 or 35, wherein fluid properties of the subsurface rock formation media are unknown.

37. A non-transitory computer program product including instructions which, when executed by at least one processor, causes the processor to a method comprising: acquiring data measurements from operation of an NMR logging tool, the data being obtained in a media in which fluid properties are known; conducting inversion processing of the data measurements to obtain an apparent T2 distribution for each data measurement; conducting inversion processing of the data measurements to obtain T2 distribution corresponding to an effective gradient; constructing a database including experimentally obtained variations of NMR data; training, via machine learning, a correction matrix model using the database; using the trained correction matrix model to determine a correction coefficient vector; modifying an inversion kernel using the vector; and generating the model by training, via machine learning, a correction matrix model using the database.

38. The computer program product as defined in paragraph 37, wherein the model is applied to process NMR logging data acquired in a subsurface rock formation media.

39. The computer program product as defined in paragraphs 37 or 38, wherein fluid properties of the subsurface rock formation media are unknown.

Furthermore, any of the illustrative methods described herein may be implemented by a system comprising processing circuitry or a non-transitory computer readable medium comprising instructions which, when executed by at least one processor, causes the processor to perform any of the methods described herein.

Although various embodiments and methods have been shown and described, the disclosure is not limited to such embodiments and methods and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A method to generate a model of an unknown magnetic field gradient distribution in a sensitive volume of a downhole nuclear magnetic resonance ("NMR") logging tool, the method comprising:

acquiring data measurements of a sensitive volume of a downhole formation from operation of the downhole NMR logging tool utilizing an radio frequency (RF) antenna and permanent magnet disposed on the NMR logging tool in a downhole environment, the data being obtained in a media in which fluid properties are known, wherein the permanent magnet aligns nuclear spins to build up into a magnetization within at least the sensitive volume, the RF antenna transmits energy to excite the nuclear spins, and the RF antenna measures excited nuclear spins from the sensitive volume to form the data measurements;

conducting inversion processing of the data to obtain an apparent spin relaxation time $T_2$ distribution for each data measurement;

computing an effect of a gradient distribution in a sensitive volume on the apparent spin relaxation time $T_2$ distribution, an effective porosity fraction and a spurious porosity fraction;

forming a gradient distribution having a spurious gradient and an effective gradient associated with the effective porosity fraction and the spurious porosity fractions; and generating the model by modifying an inversion matrix to include the effective gradient, spurious gradient, effective porosity fraction and spurious porosity fraction.

2. The method as defined in claim 1, wherein:

the inversion processing conducted to obtain the apparent spin relaxation time $T_2$ distributed is conducted with the effective gradient; and the spurious gradient is estimated.

3. The method as defined in claim 1, wherein the spurious gradient is obtained by conducting a sensor response simulation of the gradient distribution.

4. The method as defined in claim 3, wherein the spurious gradient included in the modified inversion matrix is constrained by an effective gradient and an upper bound gradient.

5. The method as defined in claim 1, wherein the model is applied to process NMR logging data acquired in a subsurface rock formation media.

6. The method as defined in claim 5, wherein fluid properties of the subsurface rock formation media are unknown.

7. The method as defined in claim 1, wherein the model is generated using machine learning.

8. A system comprising:

a downhole nuclear magnetic resonance (NMR) logging tool disposed in a downhole environment;

a control unit coupled to the NMR logging tool to control the NMR logging tool; and a downhole processor coupled to the NMR tool and the control unit to perform operations to:

acquiring data measurements of a sensitive volume of a downhole formation from operation of the downhole NMR logging utilizing an radio frequency (RF) antenna and a permanent magnet disposed on the NMR logging tool, wherein the downhole NMR logging tool is disposed in a downhole environment, the data being obtained in a media in which fluid properties are known, wherein the permanent magnet aligns nuclear spins to build up into a magnetization within at least the sensitive volume, the RF antenna transmits energy to excite the nuclear spins, and the RF antenna measures excited nuclear spins from the sensitive volume to form the data measurements;

conducting inversion processing of the data to obtain an apparent spin relaxation time $T_2$ distribution for each data measurement;

computing an effect of a gradient distribution in a sensitive volume on the apparent spin relaxation time $T_2$ distribution, an effective porosity fraction and a spurious porosity fraction;

forming a gradient distribution having a spurious gradient and an effective gradient associated with the effective porosity fraction and the spurious porosity fractions; and generating the model by modifying an inversion matrix to include the effective gradient, spurious gradient, effective porosity fraction and spurious porosity fraction.

9. The system as defined in claim 8, wherein:

the inversion processing conducted to obtain the apparent spin relaxation time T2 distributed is conducted with the effective gradient; and the spurious gradient is estimated.

10. The system as defined in claim 8, wherein the spurious gradient is obtained by conducting a sensor response simulation of the gradient distribution.

11. The system as defined in claim 10, wherein the spurious gradient included in the modified inversion matrix is constrained by an effective gradient and an upper bound gradient.

12. The system as defined in claim 8, wherein the model is applied to process NMR logging data acquired in a subsurface rock formation media.

13. The system as defined in claim 12, wherein fluid properties of the subsurface rock formation media are unknown.

14. A non-transitory computer program product including instructions which, when executed by at least one processor, causes the processor to a method comprising:

acquiring data measurements of a sensitive volume of a downhole formation from operation of a downhole NMR logging tool utilizing an radio frequency (RF) antenna and permanent magnet disposed on the downhole NMR logging tool, wherein the downhole NMR logging tool is disposed in a downhole environment, the data being obtained in a media in which fluid properties are known, wherein the permanent magnet aligns nuclear spins to build up into a magnetization within at least the sensitive volume, the RF antenna transmits energy to excite the nuclear spins, and the RF antenna measures excited nuclear spins from the sensitive volume to form the data measurements;

conducting inversion processing of the data to obtain an apparent spin relaxation time $T_2$ distribution for each data measurement;

computing an effect of a gradient distribution in a sensitive volume on the apparent spin relaxation time $T_2$ distribution, an effective porosity fraction and a spurious porosity fraction;

forming a gradient distribution having a spurious gradient and an effective gradient associated with the effective porosity fraction and the spurious porosity fractions; and generating the model by modifying an inversion matrix to include the effective gradient, spurious gradient, effective porosity fraction and spurious porosity fraction.

15. The computer program product as defined in claim 14, wherein:

the inversion processing conducted to obtain the apparent spin relaxation time $T_2$ distributed is conducted with the effective gradient; and the spurious gradient is estimated.

16. The computer program product as defined in claim 14, wherein the spurious gradient is obtained by conducting a sensor response simulation of the gradient distribution.

17. The computer program product as defined in claim 16, wherein the spurious gradient included in the modified inversion matrix is constrained by an effective gradient and an upper bound gradient.

18. The computer program product as defined in claim 14, wherein the model is applied to process NMR logging data acquired in a subsurface rock formation media.

19. The computer program product as defined in claim 18, wherein fluid properties of the subsurface rock formation media are unknown.

20. The computer program product as defined in claim 14, wherein the model is generated using machine learning.

* * * * *